(12) United States Patent
Sunaga et al.

(10) Patent No.: US 9,402,311 B2
(45) Date of Patent: Jul. 26, 2016

(54) SEMICONDUCTOR MODULE

(71) Applicant: NSK Ltd., Shinagawa-ku, Tokyo (JP)

(72) Inventors: Takashi Sunaga, Tokyo (JP); Noboru Kaneko, Tokyo (JP); Osamu Miyoshi, Tokyo (JP)

(73) Assignee: NSK Ltd., Tokyo (JP)

( * ) Notice: Subject to any disclaimer, the term of this patent is extended or adjusted under 35 U.S.C. 154(b) by 0 days.

(21) Appl. No.: 14/435,686

(22) PCT Filed: Oct. 25, 2013

(86) PCT No.: PCT/JP2013/006340
§ 371 (c)(1),
(2) Date: Apr. 14, 2015

(87) PCT Pub. No.: WO2014/068935
PCT Pub. Date: May 8, 2014

(65) Prior Publication Data
US 2015/0289369 A1    Oct. 8, 2015

(30) Foreign Application Priority Data

Nov. 5, 2012  (JP) ................................. 2012-243683
Jul. 26, 2013  (JP) ................................. 2013-155329

(51) Int. Cl.
*H05K 7/00*  (2006.01)
*H05K 1/09*  (2006.01)
(Continued)

(52) U.S. Cl.
CPC .............. *H05K 1/09* (2013.01); *H01L 23/3735* (2013.01); *H01L 23/49582* (2013.01); *H01L 23/49811* (2013.01); *H01L 24/35* (2013.01); *H01L 24/37* (2013.01); *H01L 24/41* (2013.01);
(Continued)

(58) Field of Classification Search
USPC ......... 361/760–784, 792–795, 803, 810–814; 257/685–688
See application file for complete search history.

(56) References Cited

U.S. PATENT DOCUMENTS

| 5,172,214 A * | 12/1992 | Casto ................... H01L 23/3107 257/676 |
| 7,138,673 B2 * | 11/2006 | Tanaka ............... H01L 23/49562 257/288 |
| 2007/0069344 A1 | 3/2007 | Yamashita et al. |

FOREIGN PATENT DOCUMENTS

| JP | 2000-124398 A | 4/2000 |
| JP | 2004-335725 A | 11/2004 |

(Continued)

OTHER PUBLICATIONS

Japanese Office Action dated Aug. 4, 2015 with English translation (five pages).
(Continued)

*Primary Examiner* — Tuan T Dinh
(74) *Attorney, Agent, or Firm* — Crowell & Moring LLP

(57) ABSTRACT

A semiconductor module includes a copper connector jointing an electrode formed on a top surface of a bare-chip transistor and a wiring pattern out of plural wiring patterns via a solder. The copper connector includes an electrode jointing portion jointed to the electrode of the bare-chip transistor and a substrate jointing portion arranged to face the electrode-jointing portion and jointed to the wiring pattern. The width W1 of the electrode jointing portion in a direction perpendicular to one direction is smaller than the width W2 of the substrate jointing portion in the direction perpendicular to the one direction.

6 Claims, 12 Drawing Sheets

(51) Int. Cl.
| | |
|---|---|
| *H01L 25/07* | (2006.01) |
| *H01L 25/18* | (2006.01) |
| *H01L 23/373* | (2006.01) |
| *H01L 23/498* | (2006.01) |
| *H01L 23/495* | (2006.01) |
| *H05K 1/02* | (2006.01) |
| *H05K 1/05* | (2006.01) |
| *H05K 1/18* | (2006.01) |
| *H01L 23/00* | (2006.01) |

(52) U.S. Cl.
CPC ............... *H01L 24/83* (2013.01); *H01L 24/84* (2013.01); *H01L 24/92* (2013.01); *H01L 25/07* (2013.01); *H01L 25/072* (2013.01); *H01L 25/18* (2013.01); *H05K 1/0271* (2013.01); *H05K 1/05* (2013.01); *H05K 1/181* (2013.01); *H01L 24/29* (2013.01); *H01L 24/32* (2013.01); *H01L 24/33* (2013.01); *H01L 24/40* (2013.01); *H01L 24/73* (2013.01); *H01L 2224/05553* (2013.01); *H01L 2224/0603* (2013.01); *H01L 2224/291* (2013.01); *H01L 2224/293* (2013.01); *H01L 2224/29294* (2013.01); *H01L 2224/32227* (2013.01); *H01L 2224/32238* (2013.01); *H01L 2224/33181* (2013.01); *H01L 2224/352* (2013.01); *H01L 2224/35847* (2013.01); *H01L 2224/3701* (2013.01); *H01L 2224/37013* (2013.01); *H01L 2224/37147* (2013.01); *H01L 2224/40095* (2013.01); *H01L 2224/40225* (2013.01); *H01L 2224/40227* (2013.01); *H01L 2224/40475* (2013.01); *H01L 2224/40499* (2013.01); *H01L 2224/4103* (2013.01); *H01L 2224/4112* (2013.01); *H01L 2224/48* (2013.01); *H01L 2224/73263* (2013.01); *H01L 2224/77272* (2013.01); *H01L 2224/8321* (2013.01); *H01L 2224/83191* (2013.01); *H01L 2224/83192* (2013.01); *H01L 2224/83424* (2013.01); *H01L 2224/83447* (2013.01); *H01L 2224/83815* (2013.01); *H01L 2224/84424* (2013.01); *H01L 2224/84447* (2013.01); *H01L 2224/84815* (2013.01); *H01L 2224/85* (2013.01); *H01L 2224/9221* (2013.01); *H01L 2924/014* (2013.01); *H01L 2924/1305* (2013.01); *H01L 2924/1306* (2013.01); *H01L 2924/13055* (2013.01); *H01L 2924/19105* (2013.01); *H01L 2924/3011* (2013.01); *H01L 2924/351* (2013.01); *H05K 2201/10166* (2013.01)

(56) References Cited

FOREIGN PATENT DOCUMENTS

| JP | 2005-64441 A | 3/2005 |
|---|---|---|
| JP | 2006-80180 A | 3/2006 |
| JP | 2006-245362 A | 9/2006 |
| JP | 2007-95984 A | 4/2007 |
| JP | 2007-251046 A | 9/2007 |
| JP | 2010-34350 A | 2/2010 |
| JP | 2010-50364 A | 3/2010 |
| JP | 2012-212712 A | 11/2012 |
| JP | 2012-212713 A | 11/2012 |

OTHER PUBLICATIONS

International Search Report (PCT/ISA/210) dated Jan. 14, 2014 with English translation (three pages).
Japanese-language Written Opinion (PCT/ISA/237) dated Jan. 14, 2014 with English translation (eight pages).
Chinese Office Action issued in counterpart Chinese Application No. 201380003722.6 dated Mar. 3, 2016 with English-language translation (seven (7) pages).

\* cited by examiner

Prior Art

SEMICONDUCTOR MODULE

TECHNICAL FIELD

The present invention relates to a semiconductor module such as a power module incorporated into an automotive electrical equipment.

BACKGROUND ART

In recent years, electronic devices have been introduced for controlling various electrical equipment in a vehicle such as an automobile. In an electric power steering apparatus as an example of an electrical equipment into which an electronic device is incorporated, there is provided a motor drive unit in a enclosure accommodating an electric motor for steering an automobile and the electronic device is mounted on the motor drive unit. The electronic device is incorporated as a power module into the motor drive unit.

The power module is constituted as a so-called semiconductor module on which a power element such as a field effect transistor (FET) or an insulated gate bipolar transistor (IGBT) suitable for controlling an electrical equipment driven with a relatively large current, such as an electric power steering apparatus. Such a type of power module is also called "in-vehicle module", because it is mounted on a vehicle.

As an example of such a type of semiconductor module, a semiconductor module illustrated in FIG. 17 (see PTL 1) is known. FIG. 17 is a cross-sectional view schematically illustrating an example of a semiconductor module in the related art.

The semiconductor module 100 illustrated in FIG. 17 includes a metal substrate 101, a resin 102 formed on a bottom flat surface of a recessed portion of the substrate 101, and plural copper foils (wiring patterns) 103a, 103b, 103c, and 103d formed on the resin 102. Grooves 109 are formed between the copper foil 103a and the copper foil 103d and between the copper foil 103c and the copper foil 103d. Thermal buffer plates 104a and 104b are formed on the copper foils 103a and 103b out of the copper foils 103a, 103b, 103c, and 103d, respectively, and IGBTs 105a and 105b are formed on the thermal buffer plates 104a and 104b, respectively. Each of the IGBTs 105a and 105b is a bare-chip IGBT (bare-chip transistor).

The emitter of the IGBT 105a and the copper foil 103b are jointed to each other by a wiring 106a constituted of a wire, and the emitter of the IGBT 105b and the copper foil 103c are similarly jointed to each other by a wiring 106b constituted of a wire.

In addition, the resin 102, the copper foils 103a, 103b, and 103c, the thermal buffer plates 104a and 104b, the IGBTs 105a and 105b, and the wirings 106a and 106b are sealed by a gel 107. In addition, a cover 108 covering the recessed portion of the substrate 101 is fixed to the upper portion of the substrate 101.

As another example of the semiconductor module in the related art, a semiconductor module illustrated in FIG. 18 (see PTL 2) is also known. FIG. 18 is a cross-sectional view illustrating another example of the semiconductor module in the related art.

In the semiconductor module 200 illustrated in FIG. 18, an insulating substrate 202 is jointed by soldering onto a heat-dissipating base plate 201 made of aluminum or the like.

A collector electrode 205 of an IGBT 203 is jointed by soldering onto a metal film formed on the insulating substrate 202.

On the other hand, in the semiconductor module 200, the interconnection member 206 is a flat plate member made of a highly-conductive metal material such as copper and includes an electrode-facing portion 206A facing an emitter electrode 204 of the IGBT 203, a rising portion 206B bent upward from the electrode-facing portion 206A to rise, and a lead-out portion 206C extending from the rising portion 206B. The lead-out portion 206C is connected to an external connection terminal (not illustrated). Then, the lead-out portion 206C is provided with a wavelike bent portion 206D. The bent portion 206D serves as a stress-reducing portion for absorbing a thermal expansion difference between the interconnection member 206 and the heat-dissipating base plate 201 and reducing the thermal stress.

The electrode-facing portion 206A of the interconnection member 206 and the emitter electrode 204 of the IGBT 203 are jointed to each other with a conductive resin 207. Since the conductive resin 207 has an elastic modulus lower than that of a jointing conductive material such as a solder, it is possible to effectively reduce a thermal stress.

Moreover, as another example of the semiconductor module in the related art, a semiconductor module illustrated in FIG. 19 (see PTL 3) is also known. FIG. 19 is a plan view schematically illustrating another example of the semiconductor module in the related art.

In the semiconductor module 300 illustrated in FIG. 19, plural conductive pads 301 and 302 are formed on a substrate (not illustrated). A MOS chip 303 is jointed by soldering onto one conductive pad 301 out of the plural conductive pads 301 and 302. Plural source electrodes 305 and a single gate electrode 304 are formed on the top surface of the MOS chip 303, and a drain electrode (not illustrated) is formed on the bottom surface of the MOS chip 203.

Then, the source electrodes 305 of the MOS chip 303 and the other conductive pad 302 out of the plural conductive pads 301 and 302 formed on the substrate are connected to each other via a lead 310. The lead 310 is formed by punching and bending, that is, by press forming, a metal plate. The lead 310 includes a source electrode-jointing portion 311 having a rectangular flat plate shape and extending in the X direction and the Y direction (horizontal direction) illustrated in FIG. 19, an electrode-jointing portion 312 having a plate shape and extending in the X direction and the Y direction, and a coupling portion 313 being inclined in the Z direction (up-down direction) and coupling the source electrode-jointing portion 311 and the electrode-jointing portion 312 to each other. Here, the source electrode-jointing portion 311 is jointed by soldering to the source electrodes 305 of the MOS chip 303, and the electrode-jointing portion 312 is jointed by soldering to the other conductive pad 302 out of the plural conductive pads 301 and 302 on the substrate. There is provided a pair of the other conductive pads 302 and the electrode-jointing portion 312 has a shape of a pair of leg portions jointed to the pair of conductive pads 302.

The width a of the source electrode-jointing portion 311 in the X direction is equal to or greater than the width b of the plural source electrodes 305 in the X direction.

Accordingly, it is possible to prevent a positional shift relative to the source electrode 305 due to non-uniform solder wetting on the source electrode 305 and a reflow of the solder.

CITATION LIST

Patent Literature

PTL 1: JP 2004-335725 A
PTL 2: JP 2000-124398 A
PTL 3: JP 2007-95984 A

SUMMARY OF INVENTION

Technical Problem

However, in the semiconductor module 100 illustrated in FIG. 17, the semiconductor module 200 illustrated in FIG. 18, and the semiconductor module 300 illustrated in FIG. 19 according to the related art, there are the following problems.

That is, in the semiconductor module 100 illustrated in FIG. 17, the jointing between the emitter of the IGBT 105a and the copper foil 103b and the jointing between the emitter of the IGBT 105b and the copper foil 103c are carried out using the wirings 106a and 106b constituted of a wire. Since the jointing using a wire is carried out by use of a wire bonding apparatus (not illustrated), it is necessary in the work for mounting the wirings 106a and 106b to carry out the wire bonding operation in a manufacturing process other than the solder mounting operation for mounting the IGBTs 105a and 105b and other substrate mounted components on the wiring patterns on the substrate. Accordingly, there is a problem in that the manufacturing tact time is extended, a dedicated wire bonding apparatus is necessary, thus, the manufacturing costs is increased.

In addition, in the semiconductor module 200 illustrated in FIG. 18, the free standing ability of the interconnection member 203 during the electrode-facing portion 206A of the interconnection member 206 is jointed to the emitter electrode 204 of the IGBT 203, is not mentioned at all. Therefore, when the electrode-facing portion 206A of the interconnection member 206 is jointed to the emitter electrode 204 of the IGBT 203 in a reflow furnace or the like, the interconnection member 206 may fall down. Particularly, the lead-out portion 206C of the interconnection member 206 is provided with the wave-like bent portion 206D as the stress-reducing portion, the balance of the interconnection member 206 on the IGBT 203 is poor, and the interconnection member has a shape which easily falls down. With recent demands for a decrease in size of the semiconductor module, there are demands for a decrease in size of the IGBT 203 and the interconnection member 206 so as to decrease the size of the semiconductor module. When the IGBT 203 and the interconnection member 206 decrease in size, improvement of assemblability is required, but the assemblability is not improved when the interconnection member 206 has a problem with the free-standing ability.

On the other hand, in the semiconductor module 300 illustrated in FIG. 19, the width a in the X direction of the source electrode-jointing portion 311 of the lead 310 is equal to or greater than the width b of the plural source electrodes 305 in the X direction and the source electrode-jointing portion 311 has a wide shape. On the other hand, the electrode-jointing portion 312 of the lead 310 jointed by soldering to the conductive pad 302 has a shape in the form of a pair of legs. Accordingly, since the lead 310 has a shape having a relatively good balance, the possibility that the lead 310 falls down is small when the lead 310 is jointed by soldering onto the MOS chip 303 and the substrate by reflow.

However, since the width a in the X direction of the source electrode-jointing portion 311 of the lead 310 is equal to or greater than the width b of the plural source electrodes 305 in the X direction and the source electrode-jointing portion 311 has a wide shape, if the source electrode-jointing portion 311 has torsion by the press forming, the source electrode-jointing portion 311 does not come in contact with the source electrode 305 at an appropriate position and thus the position accuracy on the solder joint degrades considerably. Accordingly, there is a problem in that the jointing reliability between the source electrode-jointing portion 311 and the source electrode 305 jointed by soldering to each other is considerably lowered.

Therefore, the present invention is made to solve the above-mentioned problems, and an object thereof is to provide a semiconductor module which makes it possible to carry out a jointing between an electrode of a bare-chip transistor and a wiring pattern on a substrate in a solder mounting operation by use of a copper connector, so as to carry out the jointing simultaneously in the same process as a solder mounting operation for mounting the bare-chip transistor or other substrate-mounted components on the wiring pattern on the substrate, and which makes it possible to surely ensure free-standing ability of the copper connector in the solder mounting operation, while improving arrangement position accuracy of the copper connector in the solder joint.

Solution to Problem

In order to achieve the above-mentioned object, according to an aspect of the present invention, there is provided a semiconductor module including: a substrate made of a metal; an insulating layer formed on the substrate; a plurality of wiring patterns formed on the insulating layer; a bare-chip transistor mounted on one wiring pattern out of the plurality of wiring patterns via a solder; and a copper connector formed of a copper plate, the copper connector jointing an electrode formed on a top surface of the bear-chip transistor and another wiring pattern out of the plurality of wiring patterns via a solder. The copper connector includes an electrode-jointing portion jointed to the electrode of the bare-chip transistor and a substrate-jointing portion arranged to face the electrode-jointing portion in one direction and jointed to the another wiring pattern out of the plurality of wiring patterns. Then, a width of the electrode-jointing portion in a direction perpendicular to the one direction is smaller than a width of the substrate-jointing portion in the direction perpendicular to the one direction.

According to this semiconductor module, the jointing between the electrode of the bare-chip transistor and the wiring pattern on the substrate can be carried out in the solder mounting operation by use of the copper connector formed of a copper plate. Therefore, the jointing between the electrode of the bare-chip transistor and the wiring pattern on the substrate can be carried out simultaneously in the same process as the solder mounting operation for mounting the bare-chip transistor or other substrate-mounted components on the wiring pattern on the substrate. Accordingly, it is possible to shorten the manufacturing tact time of the semiconductor module, to make a dedicated wire bonding apparatus unnecessary, to reduce the manufacturing costs of the semiconductor module.

Since the width of the electrode-jointing portion in the direction perpendicular to the one direction in the copper connector is smaller than the width of the substrate-jointing portion in the direction perpendicular to the one direction, the copper connector can free-stand on the top surfaces of the bare-chip transistor and the substrate at total three points of one point on the side of the electrode-jointing portion having a small width and two points on the side of the substrate-jointing portion having a large width. Accordingly, when the copper connector is jointed by soldering onto the bare-chip transistor and the substrate by reflow, it is possible to decrease a possibility that the copper connector will fall down. Since the copper connector can free-stand on the bare-chip transistor and the substrate at total three points of one point on the side of the electrode-jointing portion having a small width and two points on the side of the substrate-jointing portion having a large width, the electrode-jointing portion comes in contact with the electrode of the bare-chip transistor at an appropriate position in spite of torsion by press forming, and the position accuracy in the solder joint is improved. Accordingly, it is possible to keep high jointing reliability between the electrode-jointing portion and the electrode of the bare-chip transistor which are jointed by soldering to each other. Additionally, in order to decrease the size of the bare-chip transistor, it is preferable that the size of the electrode formed on the top surface thereof be decreased. When the width of the electrode-jointing portion is set to be smaller than the width of the substrate-jointing portion but the electrode formed on the bare-chip transistor is small, no problem is caused with the jointing reliability causes.

In addition, in the semiconductor module, the electrode-jointing portion may be located substantially at the center of the substrate-jointing portion in a width direction perpendicular to the one direction.

According to this semiconductor module, since the electrode-jointing portion is located substantially at the center of the substrate-jointing portion in the width direction perpendicular to the one direction, the electrode-jointing portion having a small width is located at a position well balanced with regard to the width direction of the substrate-jointing portion. Accordingly, when the copper connector free-stands on the bare-chip transistor and the substrate at total three points of one point on the side of the electrode-jointing portion having a small width and two points on the side of the substrate-jointing portion having a large width, it is possible to improve the free-standing ability of the copper connector by the good balance in positioning the electrode-jointing portion.

Furthermore, in the semiconductor module, a stress-reducing portion may be arranged between the electrode-jointing portion and the substrate-jointing portion.

According to this semiconductor module, it is possible to absorb a difference in linear expansion coefficient between the bare-chip transistor and the copper connector, a difference in linear expansion coefficient between the substrate and the copper connector, and a difference in linear expansion coefficient between the bare-chip transistor and the substrate by the use of the stress-absorbing portion. Accordingly, it is possible to reduce a thermal stress acting on the soldered portion between the bare-chip transistor and the copper connector and the soldered portion between the copper connector and the substrate and thus to ensure jointing reliability of the copper connector to the bare-chip transistor and the substrate. Then, when the stress-reducing portion is arranged between the electrode-jointing portion and the substrate-jointing portion, the stress-reducing portion is generally formed in a wavelike shape and thus the copper connector has a shape having difficulty in free-standing. However, by setting the width of the electrode-jointing portion in the direction perpendicular to one direction in the copper connector to be smaller than the width of the substrate-jointing portion in the direction perpendicular to one direction, the copper connector can free-stand on the bare-chip transistor and the substrate at total three points of one point on the side of the electrode-jointing portion having a small width and two points on the side of the substrate-jointing portion having a large width, thus, the free-standing ability of the copper connector is ensured.

In addition, in the semiconductor module, the stress-reducing portion may include a flat plate portion, a first coupling portion bent down from one end of the flat plate portion, and a second coupling portion bent down from another end of the flat plate portion so as to form a bridge shape, the electrode-jointing portion is formed to be bent from the first coupling portion and to extend outward, and the substrate-jointing portion is formed to be bent from the second coupling portion and to extend outward.

According to this semiconductor module, since the stress-reducing portion forms abridge of a hat shape directed upward, the stress-reducing portion can satisfactorily perform a function for reducing the stress.

Furthermore, in the semiconductor module, the first coupling portion may be formed in a tapered shape of which a width gradually decreases from the flat plate portion to the electrode-jointing portion, and a narrowest portion of the first coupling portion may be a bending baseline of the electrode-jointing portion.

According to this semiconductor module, since the bending baseline of the electrode-jointing portion is the narrowest portion of the first coupling portion having a tapered shape, the electrode-jointing portion can be easily deformed. Accordingly, when the copper connector is deformed in the solder jointing or the like due to the difference in linear expansion coefficient between the bare-chip transistor and the copper connector, the difference in linear expansion coefficient between the substrate and the copper connector, and the difference in linear expansion coefficient between the bare-chip transistor and the substrate, the electrode-jointing portion can be easily deformed at the bending baseline. As a result, it is possible to ensure jointing reliability of the electrode-jointing portion to the electrode of the bare-chip transistor.

Furthermore, in the semiconductor module, balancing rib portions may be formed at both ends of the flat plate portion in the direction perpendicular to the one direction, respectively, the balancing rib portions being bent down from the both ends, respectively.

The center of gravity of the copper connector goes down by the balancing rib portions to improve the free-standing ability. Accordingly, the free-standing ability of the copper connector is improved such that the copper connector stably free-stands on the top surfaces of the bare-chip transistor and the substrate at total three points of one point on the side of the electrode-jointing portion having a small width and two points on the side of the substrate-jointing portion having a large width. Therefore, when the copper connector is jointed by soldering to the bare-chip transistor and the substrate by reflow, it is possible to satisfactorily prevent the copper connector from falling down and thus to stabilize the solder jointing.

Furthermore, in the semiconductor module, thicknesses of the electrode-jointing portion and the substrate-jointing portion of the copper connector may be larger than thicknesses of other portions of the copper connector.

Since the thicknesses of the electrode-jointing portion and the substrate-jointing portion are larger, the center of gravity of the copper connector goes down to improve the free-standing ability. Accordingly, the free-standing ability of the copper connector is improved such that the copper connector stably free-stands on the top surfaces of the bare-chip transistor and the substrate at total three points of one point on the side of the electrode-jointing portion having a small width and two points on the side of the substrate-jointing portion having a large width. Therefore, when the copper connector is jointed by soldering to the bare-chip transistor and the substrate by reflow, it is possible to satisfactorily prevent the copper connector from falling down and thus to stabilize the solder jointing.

In addition, in the semiconductor module, the bare-chip transistor may be a bare-chip FET having a top surface on which a source electrode and a gate electrode having a joint area smaller than a joint area of the source electrode are formed, and the copper connector may be a gate-electrode copper connector of which the electrode-jointing portion is jointed to the gate electrode.

According to this semiconductor module, since the electrode-jointing portion having a small width is jointed to the gate electrode having a small area, the copper connector can be effectively used as a gate-electrode copper connector.

In the semiconductor module according to other aspects of the present invention, when the copper connector free-stands on the top surfaces of the bare-chip transistor and the substrate at total three points of one point on the side of the electrode-jointing portion having a small width and two points on the side of the substrate-jointing portion having a large width and the copper connector is jointed by soldering to the bare-chip transistor and the substrate by reflow, it is possible to prevent the copper connector from falling down.

Advantageous Effects of Invention

In the semiconductor module according to the present invention, since the jointing between the electrode of the bare-chip transistor and the wiring pattern on the substrate can be carried out in the solder mounting operation by use of the copper connector formed of a copper plate, the jointing between the electrode of the bare-chip transistor and the wiring pattern on the substrate can be carried out simultaneously in the same process as the solder mounting operation for mounting the bare-chip transistor or other substrate-mounted components on the wiring patterns on the substrate. Accordingly, it is possible to shorten the manufacturing tact time of the semiconductor module, to make a dedicated wire bonding apparatus unnecessary, and to reduce the manufacturing costs of the semiconductor module.

Since the width of the electrode-jointing portion in the direction perpendicular to the one direction in the copper connector is smaller than the width of the substrate-jointing portion in the direction perpendicular to the one direction, the copper connector can free-stand on the top surfaces of the bare-chip transistor and the substrate at total three points of one point on the side of the electrode-jointing portion having a small width and two points on the side of the substrate-jointing portion having a large width. Accordingly, when the copper connector is jointed by soldering onto the bare-chip transistor and the substrate by reflow, it is possible to decrease a possibility that the copper connector will fall down.

Since the copper connector can free-stand on the bare-chip transistor and the substrate at total three points of one point on the side of the electrode-jointing portion having a small width and two points on the side of the substrate-jointing portion having a large width, the electrode-jointing portion comes in contact with the electrode of the bare-chip transistor at an appropriate position in spite of torsion by press forming, and the position accuracy in the solder joint is improved. Accordingly, it is possible to keep high jointing reliability between the electrode-jointing portion and the electrode of the bare-chip transistor which are jointed by soldering to each other.

The center of gravity of the copper connector further goes down by the balancing rib portions bent down from both ends of the flat plate portion in the direction perpendicular to the one direction, thus, the free-standing ability is improved. Accordingly, the free-standing ability of the copper connector is improved so as to the copper connector stably stands on the top surfaces of the bare-chip transistor and the substrate. As a result, when the copper connector is jointed by soldering onto the bare-chip transistor and the substrate by reflow, it is possible to satisfactorily prevent the copper connector from falling down and thus to stably carry out the solder jointing.

DESCRIPTION OF EMBODIMENT

Figure 1:
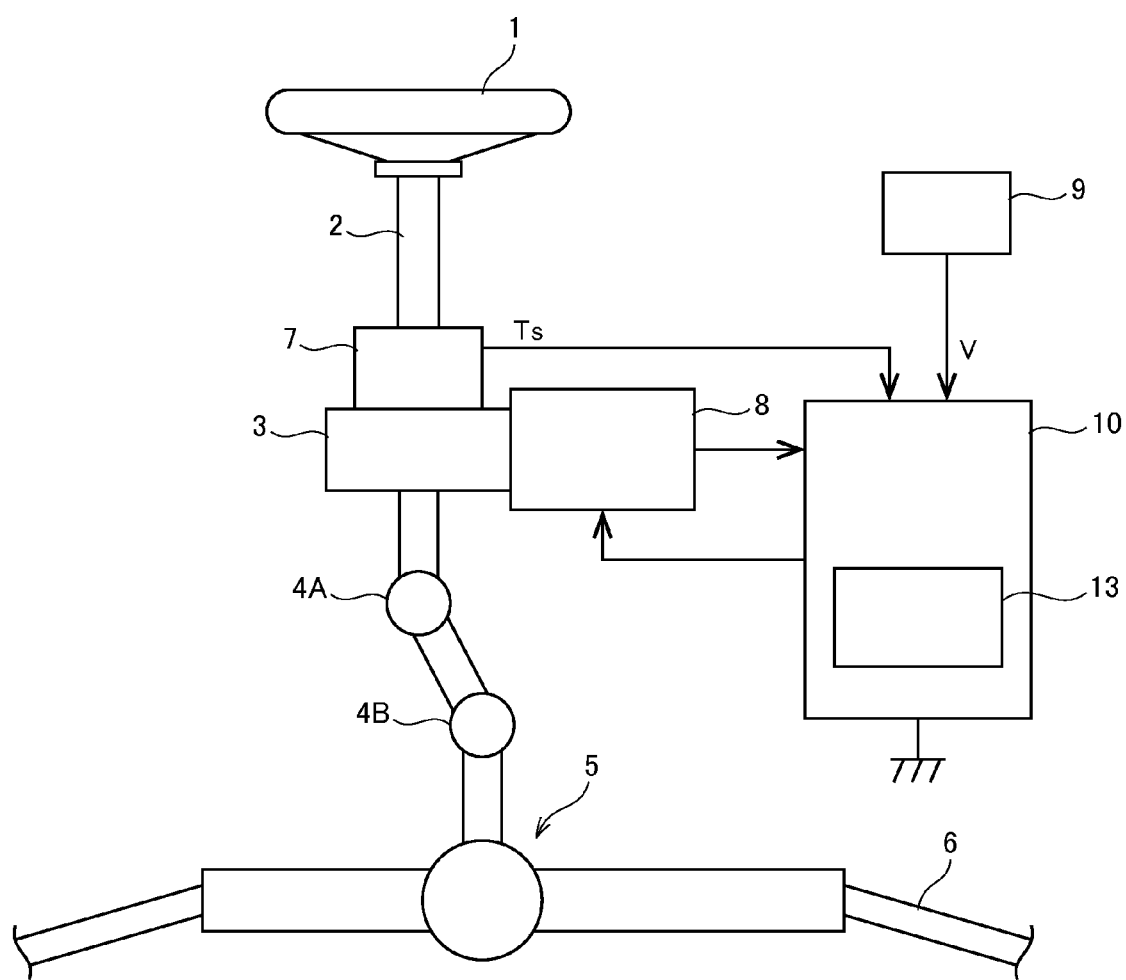
FIG. 1 is a diagram illustrating a basic structure of an electric power steering apparatus employing a semiconductor module according to the present invention.
Figure 2:
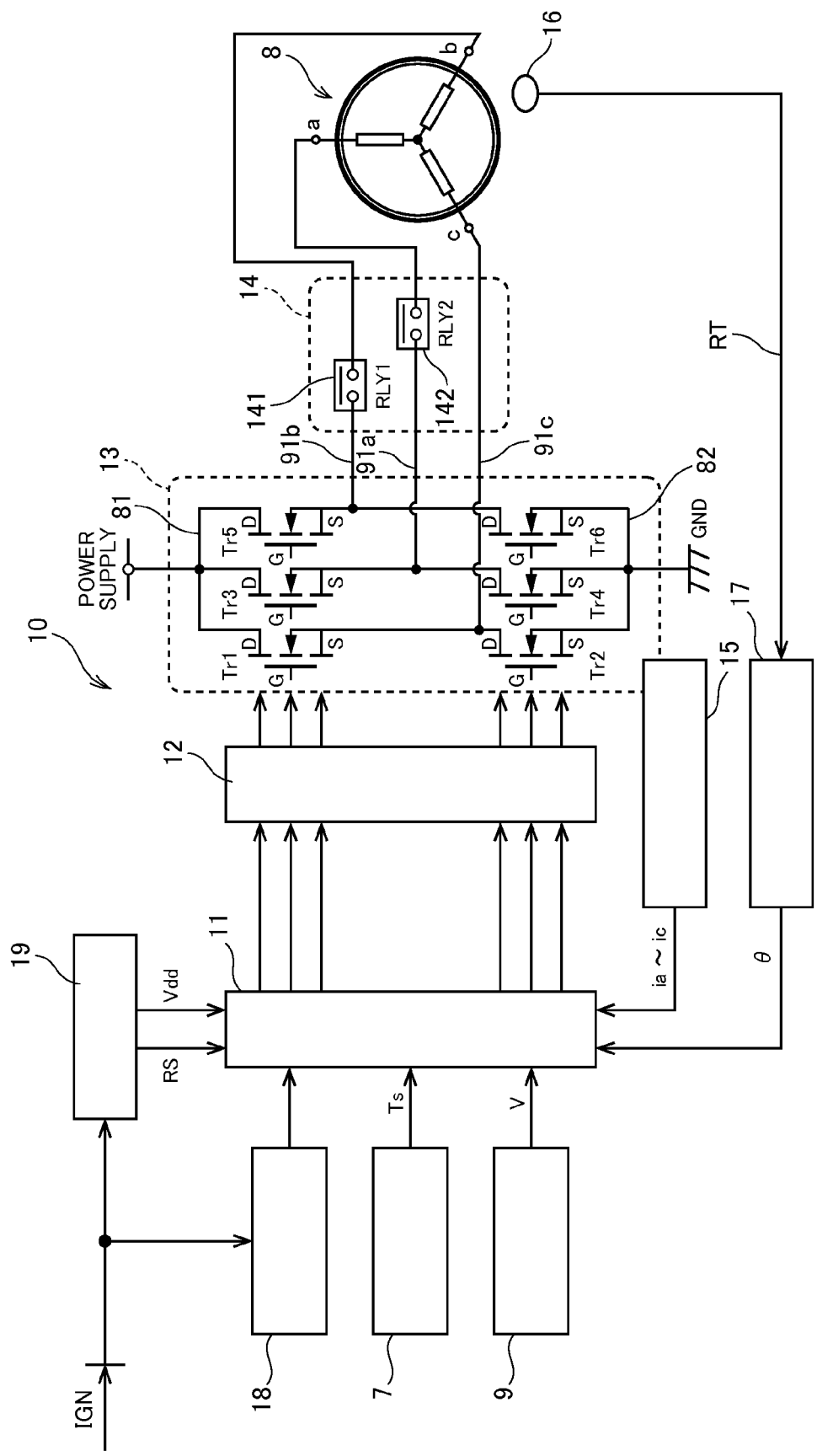
FIG. 2 is a block diagram illustrating a control system of a controller of the electric power steering apparatus illustrated in FIG. 1.
Figure 3:
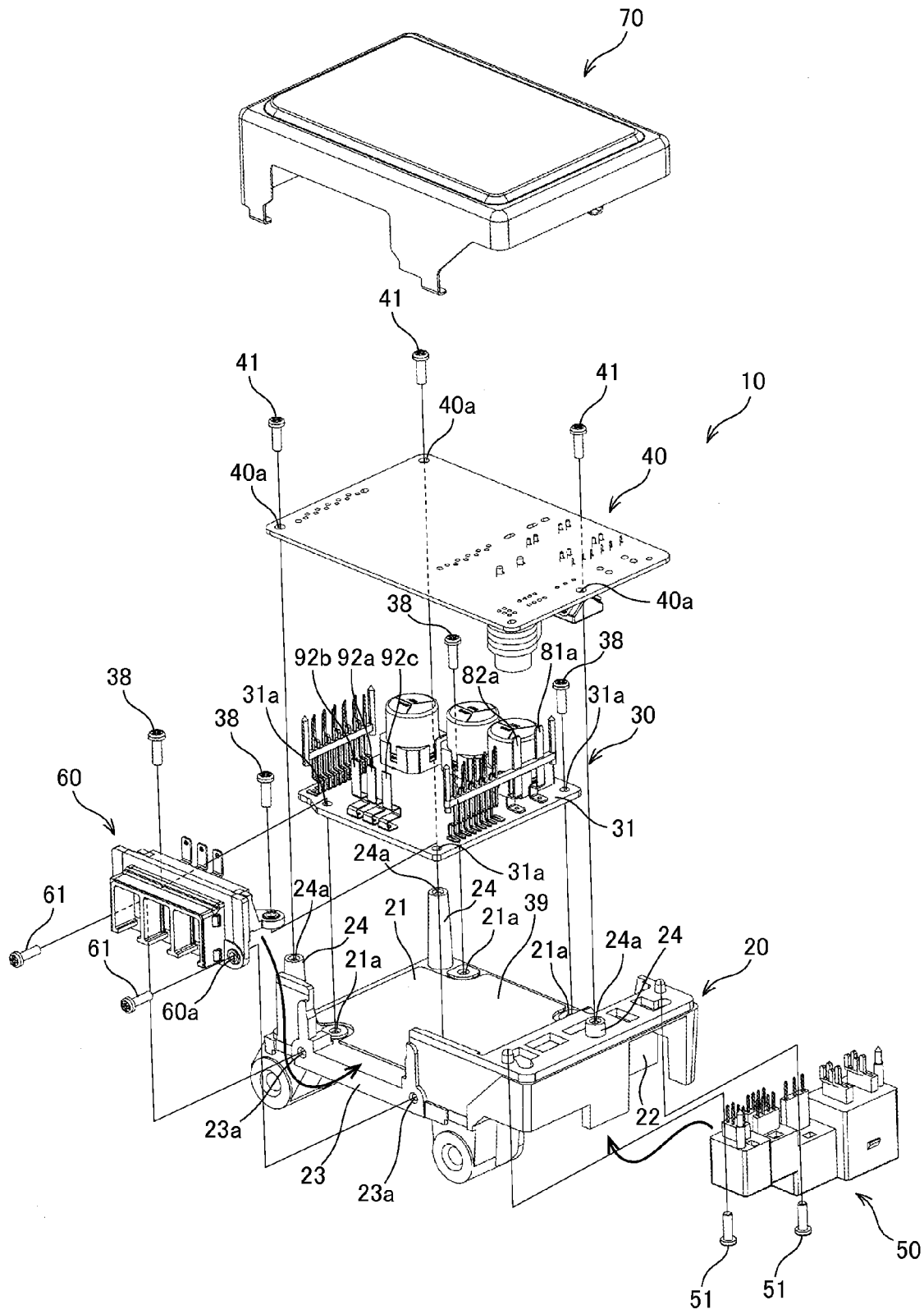
FIG. 3 is an exploded perspective view of the controller including the semiconductor module of the electric power steering apparatus illustrated in FIG. 1.
Figure 4:
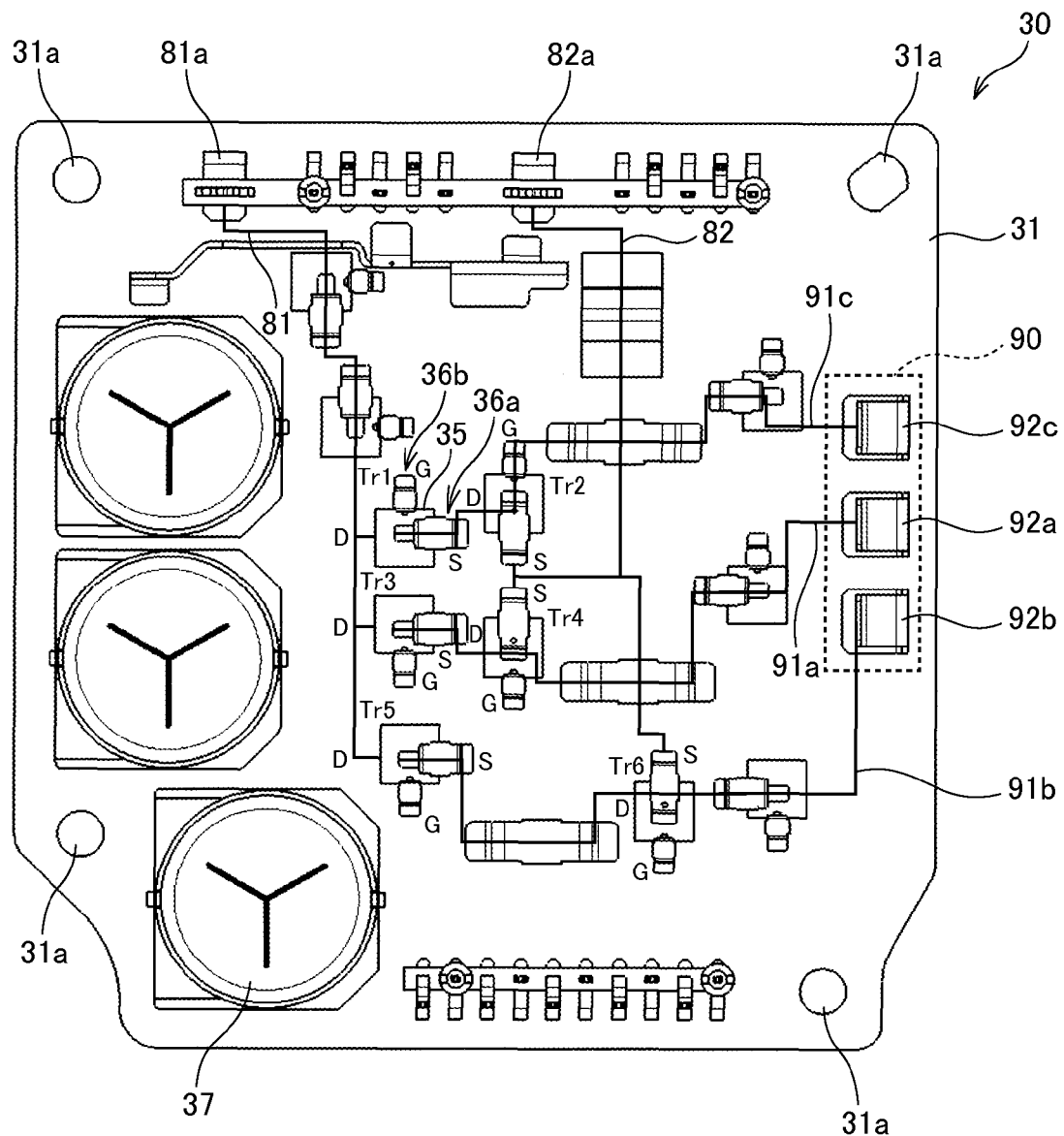
FIG. 4 is a plan view of the semiconductor module illustrated in FIG. 3.
Figure 5:
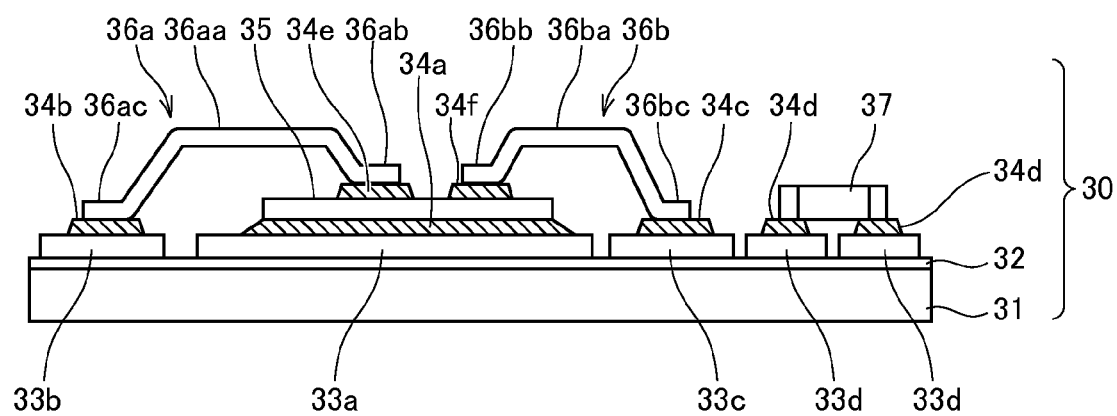
FIG. 5 is a diagram schematically illustrating a jointing state between an electrode of a bare-chip FET as a bare-chip transistor and a wiring pattern on a substrate in the semiconductor module illustrated in FIG. 3 and FIG. 4.
Figure 6:
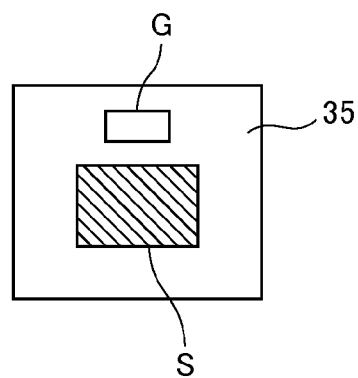
FIG. 6 is a plan view schematically illustrating a bare-chip FET.

Hereinafter, embodiments of the present invention will be described with reference to the accompanying drawings. FIG. 1 is a diagram illustrating a basic structure of an electric power steering apparatus employing a semiconductor module according to the present invention. FIG. 2 is a block diagram illustrating a control system of a controller of the electric power steering apparatus illustrated in FIG. 1. FIG. 3 is an exploded perspective view illustrating an exploded perspective view of the controller including the semiconductor module of the electric power steering apparatus illustrated in FIG. 1. FIG. 4 is a plan view of the semiconductor module illustrated in FIG. 3. FIG. 5 is a diagram schematically illustrating a jointing state between an electrode of a bare-chip FET as a bare-chip transistor and a wiring pattern on a substrate in the semiconductor module illustrated in FIG. 3 and FIG. 4. FIG. 6 is a plan view schematically illustrating the bare-chip FET.

FIG. 1 illustrates a basic structure of an electric power steering apparatus employing a semiconductor module according to the present invention. In the electric power steering apparatus, a column shaft 2 of a steering wheel 1 is coupler with tie rods 6 of steered wheels via a reduction gear 3, universal joints 4A and 4B, and a rack and pinion mechanism 5. The column shaft 2 is provided with a torque sensor 7 for detecting the steering torque of the steering wheel 1, and an electric motor 8 for assisting the steering effort of the steering wheel 1 is connected to the column shaft 2 via the reduction gear 3. A controller 10 that controls the electric power steering apparatus is supplied with electric power from a battery, not illustrated, and receives an ignition key signal IGN (see FIG. 2) via an ignition key, not illustrated. The controller 10 calculates a steering assist command value as an assist (steering assist) command on the basis of a steering torque Is detected by the torque sensor 7 and a vehicle velocity V detected by a vehicle velocity sensor 9, and controls a current supplied to the electric motor 8 on the basis of the calculated steering assist command value.

The controller 10 is mainly constituted of a micro computer, and the mechanism and configuration of the controlling apparatus thereof are illustrated in FIG.2.

The steering torque Ts detected by the torque sensor 7 and the vehicle velocity V detected by the vehicle velocity sensor 9 are received by a control calculating device 11 as a control calculating unit, and a current command value calculated by the control calculating device 11 is received by a gate drive circuit 12. A gate drive signal formed by the gate drive circuit 12 based on the current command value and the like is received by a motor drive unit 13 including a bridge configuration of FETs. The motor drive unit 13 drives the electric motor 8 constituted of a three-phase brushless motor via a breaker device 14 for emergency stop. Each of phase currents of the three-phase brushless motor is detected by a current detecting circuit 15. The detected three-phase motor currents is to is are received by the control calculating device 11 as feedback currents. In addition, the three-phase brushless motor is equipped with a rotation sensor 16 such as a Hall sensor. A rotation signal RT from the rotation sensor 16 is received by a rotor position detecting circuit 17 and the detected rotation position θ is received by the control calculating device 11.

The ignition signal IGN from the ignition key is received by an ignition voltage monitoring unit 18 and a power supply circuit unit 19. Source voltage Vdd from the power supply circuit unit 19 is received by the control calculating device 11 and a reset signal RS for stopping the apparatus is received by the control calculating device 11. The breaker device 14 is constituted of relay contacts 141 and 142 for breaking two phases.

The circuit configuration of the motor drive unit 13 will be described below. A serial connection of FETs Tr1 and Tr2, a serial connection of FETs Tr3 and Tr4, and a serial connection of FETs Tr5 and Tr6 are connected to a power supply line 81. The FETs Tr1, Tr3, and Tr5 are connected in parallel to the power supply line 81, and the FETs Tr2, Tr4, and Tr6 are connected in parallel to a ground line 82. Such a configuration constitutes an inverter. In such a configuration, in the FETs Tr1 and Tr2, the source electrode S of the FET Tr1 and the drain electrode D of the FET Tr2 are connected in series to constitute a c-phase arm of the three-phase motor, and a current is output at a c-phase output line 91c. In the FETs Tr3 and Tr4, the source electrode S of the FET Tr3 and the drain electrode D of the FET Tr4 are connected in series to constitute an a-phase arm of the three-phase motor, and a current is output at an a-phase output line 91a. In the FETs Tr5 and Tr6, the source electrode S of the FET Tr5 and the drain electrode D of the FET Tr6 are connected in series to constitute a b-phase arm of the three-phase motor and a current is output at a b-phase output line 91b.

FIG. 3 is an exploded perspective view of the controller 10 including the semiconductor module of the electric power steering apparatus illustrated in FIG. 1. The controller 10 includes a case 20, a semiconductor module 30 as a power module including the motor drive unit 13, a heat-dissipating sheet 39, a control circuit board 40 including the control calculating device 11 and the gate drive circuit 12, a power/signal connector 50, a three-phase output connector 60, and a cover 70.

Here, the case 20 is formed to have a substantially rectangular shape and includes a tabular semiconductor module placement section 21 on which the semiconductor module 30 is placed, a power/signal connector mounting section 22 arranged at an end part in a length direction of the semiconductor module placement section 21 so as to mount the power/signal connector 50 thereon, and a three-phase output connector mounting section 23 arranged at an end in a width direction of the semiconductor module placement section 21 so as to mount the three-phase output connector 60 thereon.

Plural screw holes 21a into which an attachment screw 38 for attaching the semiconductor module 30 is screwed are formed on the semiconductor module placement section 21. The semiconductor module placement section 21 and the power/signal connector mounting section 22 are provided with plural attachment posts 24 vertically standing for attaching the control circuit board 40. Screw holes 24a into which an attachment screw 41 for attaching the control circuit board 40 is screwed are formed on the attachment posts 24, respectively. Furthermore, plural screw holes 23a into which an attachment screw 61 for attaching the three-phase output connector 60 is screwed are formed on the three-phase output connector mounting section 23.

In addition, the semiconductor module 30 has the circuit configuration of the motor drive unit 13 described above. As illustrated in FIG. 4, the six FETs Tr1 to Tr6, a positive electrode terminal 81a connected to the power supply line 81, and a negative electrode terminal 82a connected to the ground line 82 are mounted on a substrate 31. A three-phase output portion 90 including an a-phase output terminal 92a connected to the a-phase output line 91a, a b-phase output terminal 92b connected to the b-phase output line 91b, and a c-phase output terminal 92c connected to the c-phase output line 91c are mounted on the substrate 31. Other substrate-mounted components 37 including a capacitor are mounted on the substrate 31. Furthermore, plural through-holes 31a into which an attachment screw 38 for attaching the semiconductor module 30 is inserted are formed on the substrate 31 of the semiconductor module 30.

Here, the mounting of the six FTTs Tr1 to Tr6 on the substrate 31 in the semiconductor module 30 will be described below. Each of the FETs Tr1 to Tr6 is constituted of a bare-chip FET (bare-chip transistor) 35 and includes a source electrode S and a gate electrode G on the bare-chip FET 35 as illustrated in FIG. 6, and includes a drain electrode, not illustrated, on the lower surface of the bare-chip FET 35.

The gate electrode G and the source electrode S formed on the top surface of the bare-chip FET 35 are arranged straightly in series in the up-down direction in FIG. 6, as illustrated in FIG. 6. The gate electrode G has a rectangular shape having a short side extending in the up-down direction in FIG. 6 and a long side perpendicular to the short side. The source electrode S has a rectangular shape having a short side extending in the up-down direction in FIG. 6 and a long side perpendicular to the short side. The short side and the long side of the source electrode S are larger than the short side and the long side of the gate electrode G, and the area of the source electrode S is greater than the area of the gate electrode G.

As illustrated in FIG. 5, the semiconductor module 30 includes the substrate 31 made of metal, and an insulating layer 32 is formed on the substrate 31. The substrate 31 is made of metal such as aluminum. In addition, plural wiring patterns 33a to 33d are formed on the insulating layer 32. Each of the wiring patterns 33a to 33d is made of metal such as copper or aluminum or alloy containing these kinds of metal. The bare-chip FET 35 constituting each of the FETs Tr1 to Tr6 is mounted on one wiring pattern 33a out of the plural wiring patterns 33a to 33d via a solder 34a. The drain electrode formed on the lower surface of the bare-chip FET 35 is connected to the wiring pattern 33a via a solder 34a. The top of the source electrode S of the bare-chip FET 35 and the top of another wiring pattern 33b out of the plural wiring patterns 33a to 33d are connected by a source-electrode copper connector 36a via solders 34e and 34b. The top of the gate electrode G of the bare-chip FET 35 and the top of still another wiring pattern 33c out of the plural wiring patterns 33a to 33d are connected by a gate-electrode copper connector 36b via solders 34f and 34c.

Here, the source-electrode copper connector 36a is formed by punching and bending a copper plate, that is, by press forming. As illustrated in FIG. 5, the source-electrode copper connector 36a includes a flat plate portion 36aa, an electrode-jointing portion 36ab extending from one end of the flat plate portion 36aa and jointed to the source electrode S of the bare-chip FET 35 via a solder 34e, and a substrate-jointing portion 36ac extending from the other end of the flat plate portion 36aa and jointed to the wiring pattern 33b via a solder 34b. The substrate-jointing portion 36ac is arranged to face the electrode-jointing portion 36ab in one direction (the lateral direction in FIG. 5).

On the other hand, the gate-electrode copper connector 36b is formed by punching and bending a copper plate, that is, by press forming. As illustrated in FIG. 5, the gate-electrode copper connector 36b includes an electrode-jointing portion 36bb jointed to the gate electrode G of the bare-chip FET 35 via a solder 34f, and a substrate-jointing portion 36bc jointed to the wiring pattern 33c via a solder 34c. The substrate-jointing portion 36bc is arranged to face the electrode-jointing portion 36bb in one direction (the lateral direction in FIG. 5).

Figure 8A:
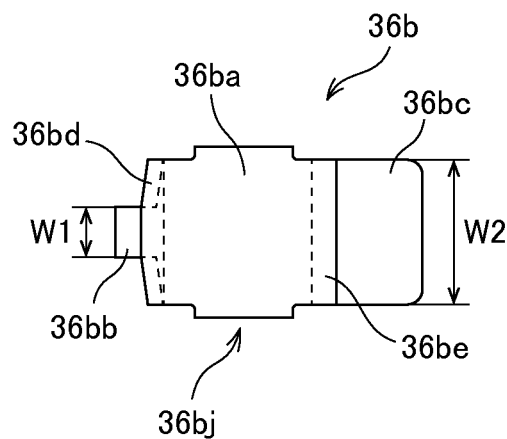
FIG. 8A is a plan view of the gate-electrode copper connector.
Figure 8C:
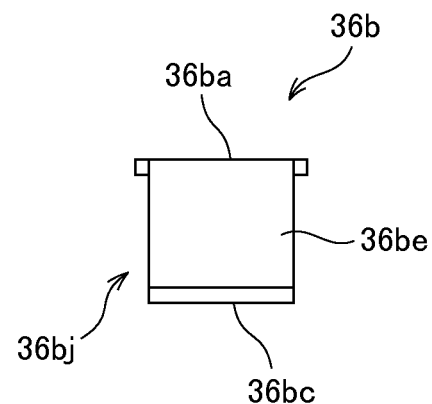
FIG. 8C is a right side view of the gate-electrode copper connector.
Figure 8B:
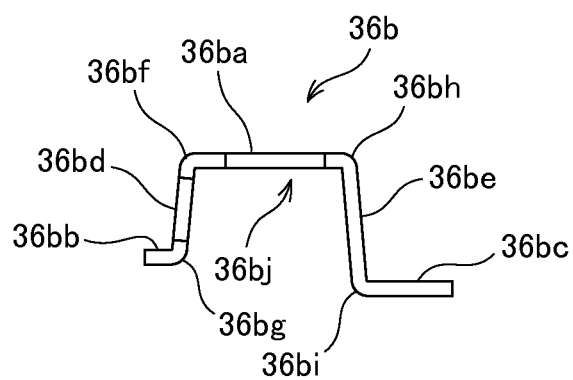
FIG. 8B is a front view of the gate-electrode copper connector.

Here, as illustrated in FIG. 8A, the width W1 of the electrode-jointing portion 36bb in the direction perpendicular to the one direction is smaller than the width W2 of the substrate-jointing portion 36bc in the direction perpendicular to the one direction.

In this way, since the width W1 of the electrode-jointing portion 36bb in the direction perpendicular to the one direction in the gate-electrode copper connector 36b is smaller than the width W2 of the substrate-jointing portion 36bc in the direction perpendicular to the one direction, the gate-electrode copper connector 36b can free-stand on the top surfaces of the bare-chip FET 35 and the substrate 31 at total three points of one point on the side of the electrode-jointing portion 36bb having a small width and two points (two points in the vicinity of both ends of the substrate-jointing portion 36bc in the width direction) on the side of the substrate-jointing portion 36bc having a large width. Accordingly, as will be described later, when the gate-electrode copper connector 36b is jointed by soldering onto the bare-chip FET 35 and the substrate 31 by a reflow, it is possible to decrease a possibility that the gate-electrode copper connector 36b will fall down. Accordingly, even when the bare-chip FET 35 and the gate-electrode copper connector 36b are decreased in size, it is possible to improve the assemblability thereof.

In addition, the gate-electrode copper connector 36b can free-stand on the bare-chip FET 35 and the substrate 31 at total three points of one point on the side of the electrode-jointing portion 36bb having a small width and two points on the side of the substrate-jointing portion 36bc having a large width. Accordingly, the electrode-jointing portion 36bb comes in contact with the gate electrode G of the bare-chip FET at an appropriate position in spite of torsion by press forming, and the position accuracy in the solder joint is improved. Accordingly, it is possible to keep high jointing reliability between the electrode-jointing portion 36*bb* and the gate electrode G of the bare-chip FET 35 which are jointed by soldering to each other. In order to decrease the size of the bare-chip FET 35, it is preferable that the size of the gate electrode G formed on the top surface thereof be decreased. When the width of the electrode-jointing portion 36*bb* is set to be smaller than the width of the substrate-jointing portion 36*bc* but the gate electrode G formed on the bare-chip FET 35 is small, the jointing reliability causes no problem.

It is noted that the gate-electrode copper connector 36*b* can very easily fall down when both the electrode-jointing portion 36*bb* and the substrate-jointing portion 36*bc* have a small width and the gate-electrode copper connector 36*b* free-stands on the bare-chip FET 35 and the substrate 31 at total two points of one point on the side of the electrode-jointing portion 36*bb* having a small width and one point on the side of the substrate-jointing portion 36*bc* having a small width.

The electrode-jointing portion 36*bb* in the gate-electrode copper connector 36*b* is located substantially at the center of the substrate-jointing portion 36*bc* in the width direction perpendicular to the one direction. Accordingly, the electrode-jointing portion 36*bb* having a small width is located at a position well balanced with regard to the width direction of the substrate-jointing portion 36*bc*. Accordingly, when the gate-electrode copper connector 36*b* free-stands on the bare-chip FET 35 and the substrate 31 at total three points of one point on the side of the electrode-jointing portion 36*bb* having a small width and two points on the side of the substrate-jointing portion 36*bc* having a large width, it is possible to improve the free-standing ability of the gate-electrode copper connector 36*b* by the good balance in positioning of the electrode-jointing portion 36*bb*.

In the gate-electrode copper connector 36*b*, a stress-reducing portion 36*bj* is arranged between the electrode-jointing portion 36*bb* and the substrate-jointing portion 36*bc*, as illustrated in FIG. 7A, FIG. 7B, and FIG. 8A to FIG. 8D.

The stress-reducing portion 36*bj* includes a flat plate portion 36*ba*, a first coupling portion 36*bd* bent down from one end of the flat plate portion 36*ba* via a first bent portion 36*bf*, and a second coupling portion 36*be* bent down from the other end of the flat plate portion 36*ba* via a third bent portion 36*bb* so as to form a bridge shape (to form a bridge of a hat shape directed upward). The electrode-jointing portion 36*bb* is bent from the first coupling portion 36*bd* via a second bent portion 36*bg* and extends outward, and the substrate-jointing portion 36*bc* is bent from the second coupling portion 36*be* via a fourth bent portion 36*bf* and extends outward.

In this way, by arranging the stress-reducing portion 36*bj* between the electrode-jointing portion 36*bb* and the substrate-jointing portion 36*bc*, it is possible to absorb a difference in linear expansion coefficient between the bare-chip FET 35 and the gate-electrode copper connector 36*b*, a difference in linear expansion coefficient between the substrate 31 and the gate-electrode copper connector 36*b*, and a difference in linear expansion coefficient between the bare-chip FET 35 and the substrate 31 by the use of the stress-absorbing portion. Accordingly, it is possible to reduce a thermal stress acting on the soldered portion between the bare-chip FET 35 and the gate-electrode copper connector 36*b* and the soldered portion between the gate-electrode copper connector 36*b* and the substrate 31, that is, the wiring pattern 33*c*, and thus to ensure jointing reliability of the gate-electrode copper connector 36*b* to the bare-chip FET 35 and the substrate 31. In addition, the substrate 31 is made of aluminum, the linear expansion coefficient thereof is about $23.6 \times 10^{-6}/^\circ C.$, and the linear expansion coefficient of the gate-electrode copper connector 36*b* is about $16.8 \times 10^{-6}/^\circ C.$ The bare-chip is made of silicon and the linear expansion coefficient thereof is about $2.5 \times 10^{-6}/^\circ C.$ On the other hand, when the stress-reducing portion 36*bj* is arranged between the electrode-jointing portion 36*bb* and the substrate-jointing portion 36*bc*, the stress-reducing portion is generally formed in a wavelike shape (a bridge shape in this embodiment) and thus the gate-electrode copper connector 36*b* has a shape having difficulty in free-standing. However, by setting the width W1 of the electrode-jointing portion 36*bb* in the direction perpendicular to the one direction in the gate-electrode copper connector 36*b* to be smaller than the width W2 of the substrate-jointing portion 36*bc* in the direction perpendicular to the one direction, the gate-electrode copper connector 36*b* can free-stand on the bare-chip FET 35 and the substrate 31 at total three points of one point on the side of the electrode-jointing portion 36*bb* having a small width and two points on the side of the substrate-jointing portion 36*bc* having a large width, thus the free-standing ability of the gate-electrode copper connector 36*b* is ensured.

In addition, since the stress-reducing portion 36*bj* forms a bridge of a hat shape directed upward, the stress-reducing portion can satisfactorily perform a function of reducing the stress.

Figure 7A:
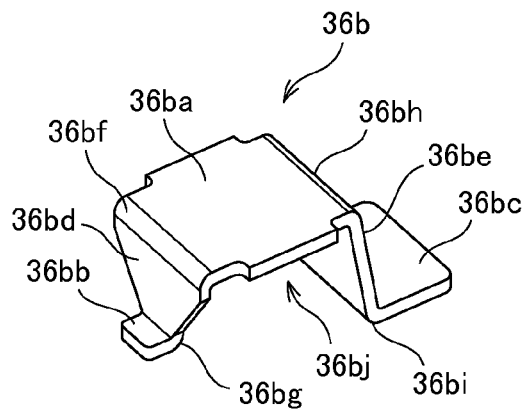
FIG. 7A is a perspective view of the gate-electrode copper connector when viewed from the upper left side.
Figure 7B:
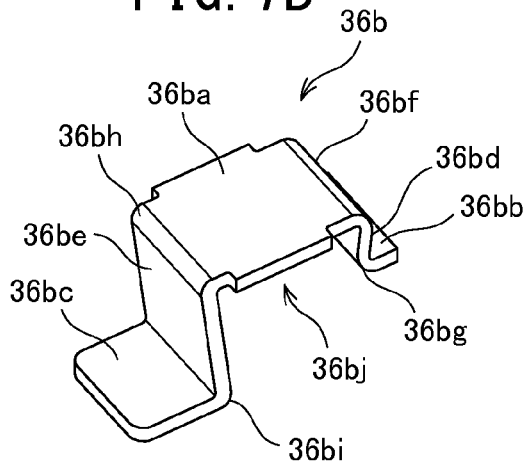
FIG. 7B is a perspective view of the gate-electrode copper connector when viewed from the upper right side.
Figure 8D:
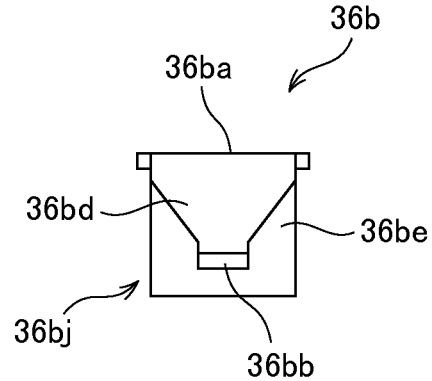
FIG. 8D is a left side view of the gate-electrode copper connector.

Furthermore, the first coupling portion 36*bd* in the gate-electrode copper connector 36*b* may be formed to have a tapered shape of which the width gradually decreases from the flat plate portion 36*ba* to the electrode-jointing portion 36*bb* as illustrated in FIG. 7A and FIG. 8D, and a bending baseline of the electrode-jointing portion 36*bb*, that is, a baseline of the second bent portion 36*bg* is the narrowest portion of the first coupling portion 36*bd*.

In this way, since the bending baseline of the electrode-jointing portion 36*bb* is the narrowest portion of the first coupling portion 36*bd* having a tapered shape, the electrode-jointing portion can be easily deformed at the bending baseline. Accordingly, when the gate-electrode copper connector 36*b* is deformed in the solder jointing or the like due to the difference in linear expansion coefficient between the bare-chip FET 35 and the gate-electrode copper connector 36*b*, the difference in linear expansion coefficient between the substrate 31 and the gate-electrode copper connector 36*b*, and the difference in linear expansion coefficient between the bare-chip FET 35 and the substrate 31, the electrode-jointing portion 36*bb* can be easily deformed at the bending baseline. As a result, it is possible to ensure jointing reliability of the electrode-jointing portion 36*bb* to the gate electrode G.

Figure 7C:
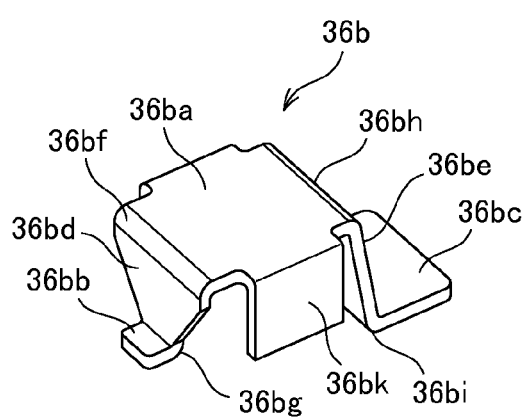
FIG. 7C is a perspective view of the gate-electrode copper connector having balancing rib portions when viewed from the upper left side.
Figure 7D:
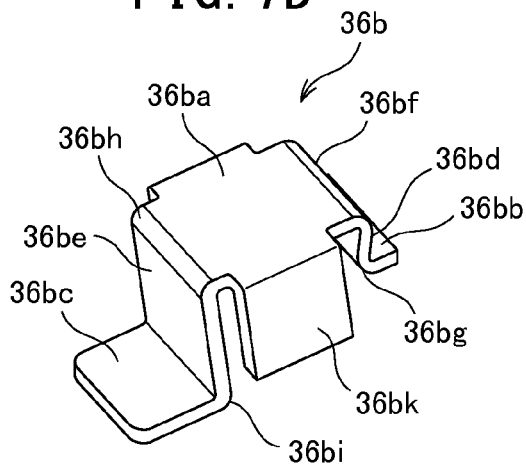
FIG. 7D is a perspective view of the gate-electrode copper connector having balancing rib portions when viewed from the upper right side.

Furthermore, in the gate-electrode copper connector 36*b*, as illustrated in FIG. 7C and FIG. 7D, balancing rib portions 36*bk* may be formed at both ends of the flat plate portion 36*ba* in the direction perpendicular to the one direction, respectively, the balancing rib portions 36*bk* being bent down from the both ends, and the flat plate portion 36*ba* being arranged between the electrode-jointing portion 36*bb* and the substrate-jointing portion 36*bc*.

The center of gravity of the gate-electrode copper connector 36*b* goes down by the balancing rib portions 36*bk* to improve the free-standing ability of the gate-electrode copper connector 36*b*. Accordingly, the free-standing ability is improved such that the gate-electrode copper connector 36*b* stably free-stands on the top surfaces of the bare-chip transistor and the substrate at total three points of one point on the side of the electrode-jointing portion 36*bb* having a small width and two points on the side of the substrate-jointing portion 36*bc* having a large width. Therefore, when the gate-electrode copper connector 36*b* is jointed by soldering to the bare-chip transistor and the substrate by reflow, it is possible to satisfactorily prevent the gate-electrode copper connector 36b from falling down, and reliability of the solder joint is improved.

Figure 7E:
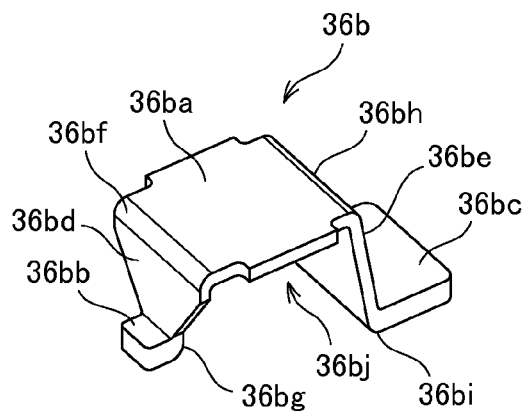
FIG. 7E is a perspective view of the gate-electrode copper connector including an electrode-jointing portion and a substrate-jointing portion having a large thickness when viewed from the upper left side.
Figure 7F:
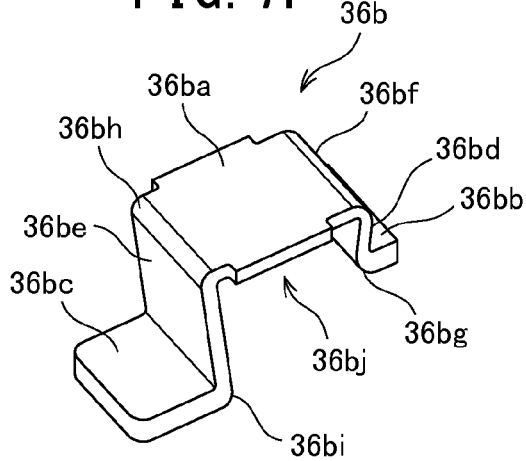
FIG. 7F is a perspective view of the gate-electrode copper connector including an electrode-jointing portion and a substrate-jointing portion having a large thickness when viewed from the upper right side.

Furthermore, in the gate-electrode copper connector 36b, as illustrated in FIG. 7E and FIG. 7F, the thicknesses of the electrode-jointing portion 36bb and the substrate-jointing portion 36bc of the gate-electrode copper connector 36b may be larger than the thicknesses of the other portions (that is, the flat plate portion 36ba, the first coupling portion 36bd, and the second coupling portion 36be) of the gate-electrode copper connector 36b. The thicknesses of the electrode-jointing portion 36bb and the substrate-jointing portion 36bc may be, but not particularly limited to, for example, about three times the thicknesses of the other portions (that is, the flat plate portion 36ba, the first coupling portion 36bd, and the second coupling portion 36be) of the gate-electrode copper connector 36b.

Since the thicknesses of the electrode-jointing portion 36bb and the substrate-jointing portion 36bc are larger, the center of gravity of the gate-electrode copper connector 36b goes down to improve the free-standing ability. Accordingly, the free-standing ability is improved such that the gate-electrode copper connector 36b stably free-stands on the top surfaces of the bare-chip transistor and the substrate at total three points of one point on the side of the electrode-jointing portion 36bb having a small width and two points on the side of the substrate-jointing portion 36bc having a large width. Therefore, when the gate-electrode copper connector 36b is jointed by soldering to the bare-chip transistor and the substrate by reflow, it is possible to satisfactorily prevent the gate-electrode copper connector 36b from falling down, and reliability of the solder joint is improved.

It is noted that in the semiconductor module 30 illustrated in FIG. 5, another substrate-mounted component 37 such as a capacitor is mounted on yet still another wiring pattern 33d out of the plural wiring patterns 33a to 33d formed on the insulating layer 32 via a solder 34d.

The semiconductor module 30 having this configuration is mounted on the semiconductor module placement section 21 of the case 20 with plural attachment screws 38 as illustrated in FIG. 3. Plural through-holes 31a into which the attachment screws 38 are inserted are formed in the substrate 31 of the semiconductor module 30.

It is noted that when the semiconductor module 30 is attached onto the semiconductor module placement section 21, the heat-dissipating sheet 39 is attached onto the semiconductor module placement section 21 and the semiconductor module 30 is attached onto the top of the heat-dissipating sheet 39. By use of the heat-dissipating sheet 39, heat generated in the semiconductor module 30 is dissipated to the case 20 via the heat-dissipating sheet 39.

In addition, a control circuit including the control calculating device 11 and the gate drive circuit 12 is constructed by mounting plural electronic components on the control circuit board 40. After the semiconductor module 30 is attached onto the semiconductor module placement section 21, the control circuit board 40 is attached onto the plural attachment posts 24 vertically standing on the semiconductor module placement section 21 and the power/signal connector mounting section 22 with the plural attachment screws 41 from the upper side of the semiconductor module 30. Plural through-holes 40a into which the attachment screws 41 are inserted are formed in the control circuit board 40.

The power/signal connector 50 is used to supply DC power from a battery (not illustrated) to the semiconductor module 30 and to receive various signals including signals from the torque sensor 12 and the vehicle velocity sensor 9 by the control circuit board 40. The power/signal connector 50 is attached onto the power/signal connector mounting section 22 arranged on the semiconductor module placement section 21 with plural attachment screws 51.

The three-phase output connector 60 is used to output currents from the a-phase output terminal 92a, the b-phase output terminal 92b, and the c-phase output terminal 92c. The three-phase output connector 60 is attached onto the three-phase output connector mounting section 23 arranged at an end of the semiconductor module placement section 21 in the width direction with plural attachment screws 61. Plural through-holes 60a into which the attachment screws 61 are inserted are formed in the three-phase output connector 60.

Furthermore, the cover 70 is attached onto the case 20 to which the semiconductor module 30, the control circuit board 40, the power/signal connector 50, and the three-phase output connector 60 are attached so as to cover the control circuit board 40 from the above of the control circuit board 40.

Next, a method of manufacturing the semiconductor module 30 will be described below with reference to FIG. 9A to FIG. 9E.

Figure 9A:
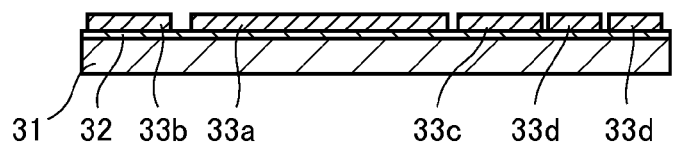
FIG. 9A to FIG. 9E are diagrams illustrating a manufacturing process of a semiconductor module.

In manufacturing the semiconductor module 30, first, as illustrated in FIG. 9A, the insulating layer 32 is formed on one main surface of the substrate 31 made of metal (insulating layer forming step).

Then, as illustrated in FIG. 9A, the plural wiring patterns 33a to 33d are formed on the insulating layer 32 (wiring pattern forming step).

Figure 9B:
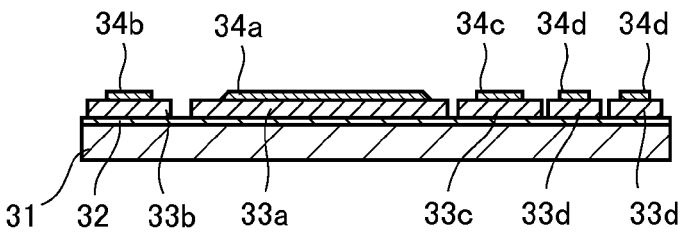

Thereafter, as illustrated in FIG. 9B, solder pastes (the solders 34a to 34d) are applied on the plural wiring patterns 33a to 33d, respectively (solder paste applying step).

Figure 9C:
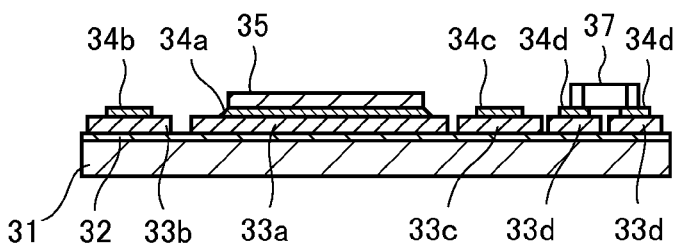

Then, as illustrated in FIG. 9C, one bare-chip FET 35 is mounted on the solder paste (the solder 34a) applied onto one wiring pattern 33a out of the plural wiring patterns 33a to 33d (bare-chip FET mounting step), and the other substrate-mounted component 37 is mounted on the solder paste (the solder 34d) applied onto another wiring pattern 33d. Another bare-chip FET 35 is also mounted on a wiring pattern identical to or different from the wiring pattern 33a.

Figure 9D:
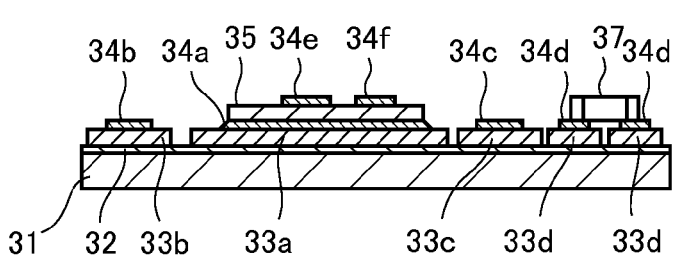

Subsequently, as illustrated in FIG. 9D, a solder paste (the solders 34e and 34f) is applied onto the source electrode S and the gate electrode G formed on the top surface of the bare-chip FET 35 (solder paste applying step).

Figure 9E:
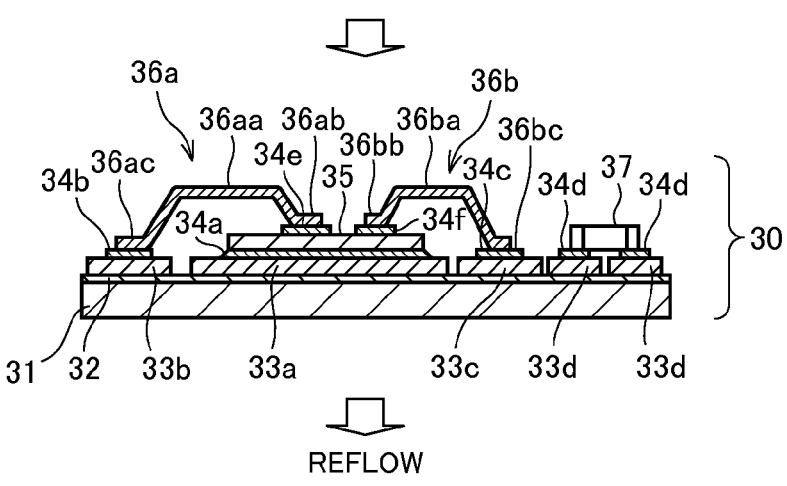

Thereafter, as illustrated in FIG. 9E, the source-electrode copper connector 36a is mounted on the solder paste (the solder 34e) applied onto the source electrode S of the bare-chip FET 35 and the solder paste (the solder 34b) applied onto the wiring pattern 33b other than the wiring pattern 33a, on which the bare-chip FET 35 is mounted, out of the plural wiring patterns 33a to 33d (source-electrode copper connector mounting step).

In addition, as illustrated in FIG. 9E, the gate-electrode copper connector 36b is mounted on the solder paste (the solder 34f) applied onto the gate electrode G of the bare-chip FET 35 and the solder paste (the solder 34c) applied onto still another wiring pattern 33c other than the wiring pattern 33a on which the bare-chip FET 35 is mounted and other than the wiring pattern 33b on which the source-electrode copper connector 36a is mounted, out of the plural wiring patterns 33a to 33d (gate-electrode copper connector mounting step). An intermediate semiconductor module assembly is constructed in this way.

The intermediate semiconductor module assembly constructed through the steps described above is put into a reflow furnace (not illustrated), and the jointing between one wiring pattern 33a out of the plural wiring patterns 33a to 33d and the bare-chip FET 35 via the solder 34a, the jointing between the wiring pattern 33d and the other substrate-mounted component 37 via the solder 34d, the jointing between the source electrode S formed on the top surface of the bare-chip FET 35 and the source-electrode copper connector 36a via the solder 34e, the jointing between another wiring pattern 33b out of the plural wiring patterns 33a to 33d and the source-electrode copper connector 36a, the jointing between the gate electrode G formed on the top surface of the bare-chip FET 35 and the gate-electrode copper connector 36b via the solder 34f, and the jointing between still another wiring pattern 33c out of the plural wiring patterns 33a to 33d and the gate-electrode copper connector 36b via the solder 34c are collectively carried out (jointing step).

The semiconductor module 30 is completed in this way.

Here, since the source electrode S of the bare-chip FET 35 and the wiring pattern 33b on the substrate 31 can be jointed using the source-electrode copper connector 36a by the solder mounting operation and the gate electrode G of the bare-chip FET 35 and another wiring pattern 33c on the substrate 31 can be jointed using the gate-electrode copper connector 36b by the solder mounting operation, it is possible to carry out the jointing between the source electrode S of the bare-chip FET 35 and the wiring pattern 33b on the substrate 31 and the jointing between the gate electrode G of the bare-chip FET 35 and another wiring pattern 33c on the substrate 31, simultaneously in the same process as the solder mounting operation for mounting the bare-chip FET 35 or the other substrate-mounted component 37 on the wiring patterns 33a and 33d on the substrate 31. As a result, it is possible to shorten the manufacturing tact time of the semiconductor module 30, to make a dedicated wire bonding apparatus unnecessary, and to reduce the manufacturing costs of the semiconductor module 30.

In addition, in the jointing step in a reflow furnace, the width W1 of the electrode-jointing portion 36bb in the direction perpendicular to the one direction in the gate-electrode copper connector 36b is smaller than the width W2 of the substrate-jointing portion 36bc in the direction perpendicular to the one direction, and the gate-electrode copper connector 36b can free-stand on the top surfaces of the bare-chip FET 35 and the substrate 31 at total three points of one point on the side of the electrode-jointing portion 36bb having a small width and two points (two points in the vicinity of both ends of the substrate-jointing portion 36bc in the width direction) on the side of the substrate-jointing portion 36bc having a large width. Accordingly, when the gate-electrode copper connector 36b is jointed by soldering onto the bare-chip FET 35 and the substrate 31 by a reflow, it is possible to decrease a possibility that the gate-electrode copper connector 36b will fall down. Accordingly, even when the bare-chip FET 35 and the gate-electrode copper connector 36b are decreased in size, it is possible to improve the assemblability thereof.

Next, a first modification example of the gate-electrode copper connector will be described below with reference to FIG. 10A and FIG. 10B.

Figure 10A:
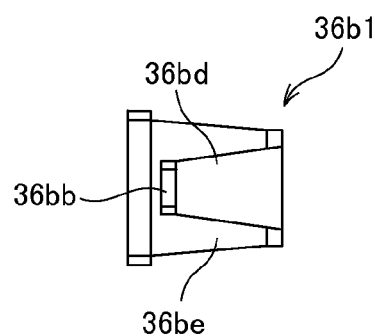
FIG. 10A is a left side view of a first modification example of the gate-electrode copper connector.
Figure 10B:
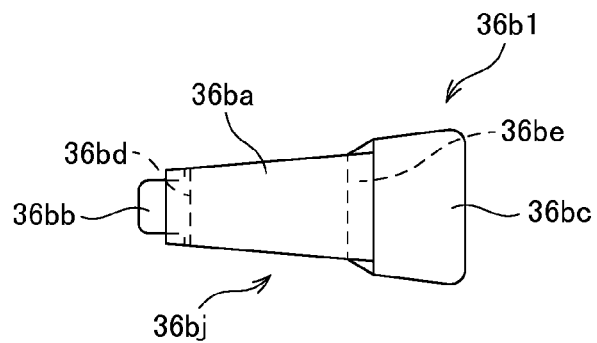
FIG. 10B is a plan view of a first modification example of the gate-electrode copper connector.

A gate-electrode copper connector 36b1 illustrated in FIG. 10A and FIG. 10B has the same basic configuration as the gate-electrode copper connector 36b illustrated in FIG. 8A to FIG. 8D, but is different therefrom in the shapes of the substrate-jointing portion 36bc, the second coupling portion 36be, the flat plate portion, the first coupling portion 36bd, and the electrode-jointing portion 36bb.

That is, the blank of the gate-electrode copper connector 36b1 formed in press forming has a tapered shape, in which the widths of the electrode-jointing portion 36bb, the first coupling portion 36bd, the flat plate portion, the second coupling portion 36be, and the substrate-jointing portion 36bc is smaller in that order, and in which the tapered faces are uniformly formed in both sides. Thereafter, the blank is bent to constitute the gate-electrode copper connector 36b1.

In the gate-electrode copper connector 36b1, the width of the electrode-jointing portion 36bb in the direction perpendicular to the one direction in the gate-electrode copper connector 36b1 is smaller than the width of the substrate-jointing portion 36bc in the direction perpendicular to the one direction, and the gate-electrode copper connector 36b1 can free-stand on the top surfaces of the bare-chip FET 35 and the substrate 31 at total three points of one point on the side of the electrode-jointing portion 36bb having a small width and two points (two points in the vicinity of both ends of the substrate-jointing portion 36bc in the width direction) on the side of the substrate-jointing portion 36bc having a large width. Accordingly, when the gate-electrode copper connector 36b1 is jointed by soldering onto the bare-chip FET 35 and the substrate 31 by a reflow, it is possible to decrease a possibility that the gate-electrode copper connector 36b2 will fall down. Accordingly, even when the bare-chip FET 35 and the gate-electrode copper connector 36b are decreased in size, it is possible to improve the assemblability thereof.

The electrode-jointing portion 36bb in the gate-electrode copper connector 36b1 is located substantially at the center of the substrate-jointing portion 36bc in the width direction perpendicular to the one direction. Accordingly, the electrode-jointing portion 36bb having a small width is located at a position well balanced with regard to the width direction of the substrate-jointing portion 36bc. Accordingly, when the gate-electrode copper connector 36b1 free-stands on the bare-chip FET 35 and the substrate 31 at total three points of one point on the side of the electrode-jointing portion 36bb having a small width and two points on the side of the substrate-jointing portion 36bc having a large width, it is possible to improve the free-standing ability of the gate-electrode copper connector 36b1 by the good balance in positioning of the electrode-jointing portion 36bb.

Next, a second modification example of the gate-electrode copper connector will be described below with reference to FIG. 11A and FIG. 11B.

Figure 11A:
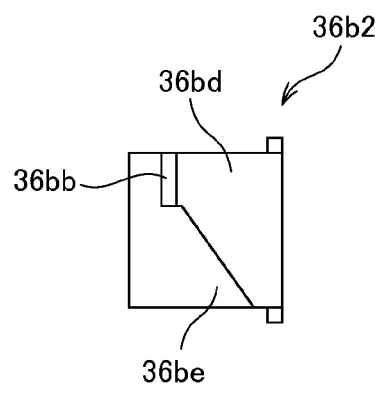
FIG. 11A is a left side view of a second modification example of the gate-electrode copper connector.
Figure 11B:
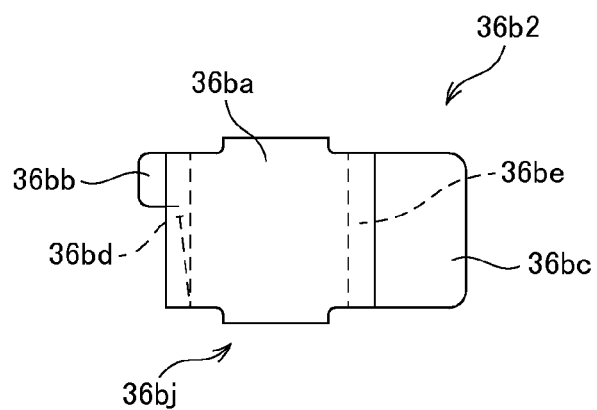
FIG. 11B is a plan view of a second modification example of the gate-electrode copper connector.

A gate-electrode copper connector 36b2 illustrated in FIG. 11A and FIG. 11B has the same basic configuration as the gate-electrode copper connector 36b illustrated in FIG. 8A to FIG. 8D, but is different therefrom in the shape of the first coupling portion 36bd and the position of the electrode-jointing portion 36bb.

That is, in the gate-electrode copper connector 36b2, one edge of the first coupling portion 36bd straightly extends along one edge of the flat plate portion 36ba and the other edges obliquely extends to the one edge so as to gradually reduce the width of the first coupling portion 36bd, as illustrated in FIG. 11A. Then, the electrode-jointing portion 36bb is located close to the one edge in the width direction of the substrate-jointing portion 36bc.

In the gate-electrode copper connector 36b2, the width of the electrode-jointing portion 36bb in the direction perpendicular to the one direction in the gate-electrode copper connector 36b2 is smaller than the width of the substrate-jointing portion 36bc in the direction perpendicular to the one direction, and the gate-electrode copper connector 36b2 can free-stand on the top surfaces of the bare-chip FET 35 and the substrate 31 at total three points of one point on the side of the electrode-jointing portion 36bb having a small width and two points (two points in the vicinity of both ends of the substrate-jointing portion 36bc in the width direction) on the side of the substrate-jointing portion 36bc having a large width. Accordingly, when the gate-electrode copper connector 36b2 is jointed by soldering onto the bare-chip FET 35 and the substrate 31 by a reflow, it is possible to decrease a possibility that the gate-electrode copper connector 36*b*2 will fall down. Accordingly, even when the bare-chip FET 35 and the gate-electrode copper connector 36*b* are decreased in size, it is possible to improve the assemblability thereof.

As described above, the electrode-jointing portion 36*bb* of the gate-electrode copper connector 36*b*2 is located close to the one edge in the width direction of the substrate-jointing portion 36*bc* and the balance is not good. However, the balance of the free-standing ability of the gate-electrode copper connector 36*b*2 is adjusted by the use of the width (weight) of the flat plate portion 36*ba*. Accordingly, the electrode-jointing portion 36*bb* having a small width is balanced well with regard to the width direction of the substrate-jointing portion 36*bc*. Accordingly, when the gate-electrode copper connector 36*b*2 free-stands on the bare-chip FET 35 and the substrate 31 at total three points of one point on the side of the electrode-jointing portion 36*bb* having a small width and two points on the side of the substrate-jointing portion 36*bc* having a large width, it is possible to improve the free-standing ability of the gate-electrode copper connector 36*b*2.

Figure 12A:
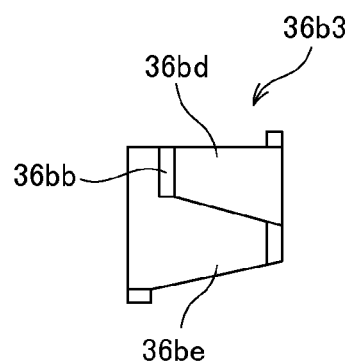
FIG. 12A is a left side view of a third modification example of the gate-electrode copper connector.

Furthermore, a third modification example of the gate-electrode copper connector will be described below with reference to FIG. 12A and FIG. 12B.

Figure 12B:
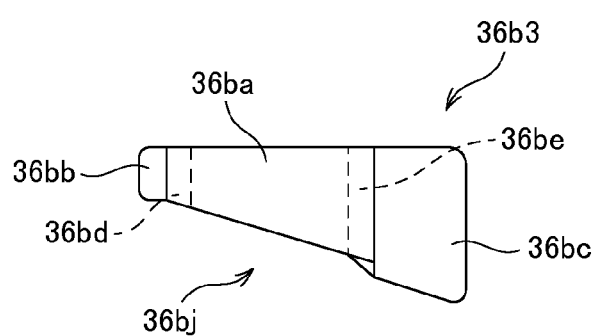
FIG. 12B is a plan view of a third modification example of the gate-electrode copper connector.

A gate-electrode copper connector 36*b*3 illustrated in FIG. 12 and FIG. 12B has the same basic configuration as the gate-electrode copper connector 36*b* illustrated in FIG. 8A to FIG. 8D, but is different therefrom in the shapes of the substrate-jointing portion 36*bc*, the second coupling portion 36*be*, the flat plate portion, the first coupling portion 36*bd*, and the electrode-jointing portion 36*bb*.

That is, the blank of the gate-electrode copper connector 36*b*3 formed in press forming has a tapered shape, in which the widths of the electrode-jointing portion 36*bb*, the first coupling portion 36*bd*, the flat plate portion, the second coupling portion 36*be*, and the substrate-jointing portion 36*bc* is smaller in that order, and in which the tapered face is formed only in one side. Thereafter, the blank is bent to constitute the gate-electrode copper connector 36*b*3.

In the gate-electrode copper connector 36*b*3, the width of the electrode-jointing portion 36*bb* in the direction perpendicular to the one direction in the gate-electrode copper connector 36*b*3 is smaller than the width of the substrate-jointing portion 36*bc* in the direction perpendicular to the one direction, and the gate-electrode copper connector 36*b*3 can free-stand on the top surfaces of the bare-chip FET 35 and the substrate 31 at total three points of one point on the side of the electrode-jointing portion 36*bb* having a small width and two points (two points in the vicinity of both ends of the substrate-jointing portion 36*bc* in the width direction) on the side of the substrate-jointing portion 36*bc* having a large width. Accordingly, when the gate-electrode copper connector 36*b*3 is jointed by soldering onto the bare-chip FET 35 and the substrate 31 by a reflow, it is possible to decrease a possibility that the gate-electrode copper connector 36*b*2 will fall down. Accordingly, even when the bare-chip FET 35 and the gate-electrode copper connector 36*b* are decreased in size, it is possible to improve the assemblability thereof.

In addition, the electrode-jointing portion 36*bb* of the gate-electrode copper connector 36*b*3 is located close to the one edge in the width direction of the substrate-jointing portion 36*bc*, however, since the electrode-jointing portion 36*bb* is coupled to the flat plate portion 36*ba* via the first coupling portion 36*bd* having a tapered shape, and the balance is relatively good.

A first modification example of the stress-reducing portion applied to the gate-electrode copper connector illustrated in FIG. 8A to FIG. 8D, and the first to third modification examples of the gate-electrode copper connector illustrated in FIG. 10A, FIG. 10B, FIG. 11A, FIG. 11B, FIG. 12A, and FIG. 12B will be described below with reference to FIG. 13.

Figure 13:
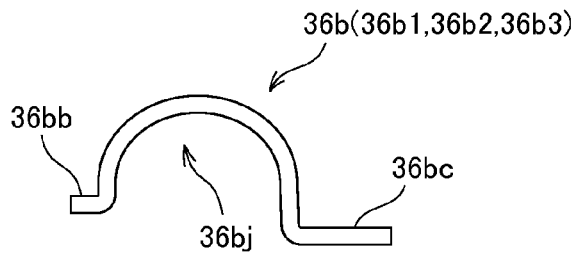
FIG. 13 is a diagram illustrating a first modification example of a stress-reducing portion applied to the gate-electrode copper connector illustrated in FIG. 8A to FIG. 8D, and the first to third modification examples of the gate-electrode copper connector illustrated in FIG. 10A, FIG. 10B, FIG. 11A, FIG. 11B, FIG.12A, and FIG. 12B.

The shape of the stress-reducing portion 36*bj* of the gate-electrode copper connector 36*b* illustrated in FIG. 13 can be applied to any of the gate-electrode copper connector 36*b* illustrated in FIG. 8A to FIG. 8D, and the first to third modification examples 36*b*1, 36*b*2, and 36*b*3 of the gate-electrode copper connector illustrated in FIG. 10A, FIG. 10B, FIG. 11A, FIG. 11B, FIG.12A, and FIG. 12B, and the stress-reducing portion 36*bj* has a curved shape which is convex upward. The electrode-jointing portion 36*bb* is bent from one end of the stress-reducing portion 36*bj* and extends outward, and the substrate-jointing portion 36*bc* is bent from the other end of the stress-reducing portion 36*bj* and extends outward.

Even when the stress-reducing portion 36*bj* is formed in a curved shape which is convex upward, it is possible to absorb the difference in linear expansion coefficient between the bare-chip FET 35 and the gate-electrode copper connector 36*b*, the difference in linear expansion coefficient between the substrate 31 and the gate-electrode copper connector 36*b*, and the difference in linear expansion coefficient between the bare-chip FET 35 and the substrate 31.

A second modification example of the stress-reducing portion applied to the gate-electrode copper connector illustrated in FIG. 8A to FIG. 8D, and the first to third modification examples of the gate-electrode copper connector illustrated in FIG. 10A, FIG. 10B, FIG. 11A, FIG. 11B, FIG. 12A, and FIG. 12B will be described below with reference to FIG. 14.

Figure 14:
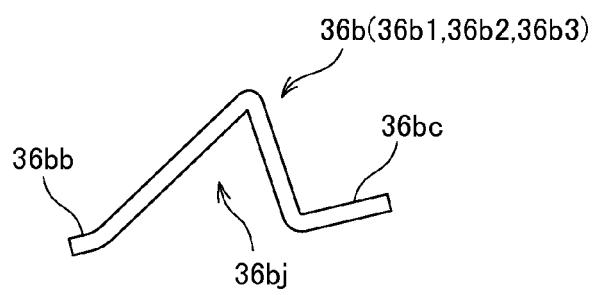
FIG. 14 is a diagram illustrating a second modification example of the stress-reducing portion applied to the gate-electrode copper connector illustrated in FIG. 8A to FIG. 8D, and the first to third modification examples of the gate-electrode copper connector illustrated in FIG. 10A, FIG. 10B, FIG. 11A, FIG. 11B, FIG.12A, and FIG. 12B.

The shape of the stress-reducing portion 36*bj* of the gate-electrode copper connector 36*b* illustrated in FIG. 14 can be applied to any of the gate-electrode copper connector 36*b* illustrated in FIG. 8A to FIG. 8D, and the first to third modification examples 36*b*1, 36*b*2, and 36*b*3 of the gate-electrode copper connector illustrated in FIG. 10A, FIG. 10B, FIG. 11A, FIG. 11B, FIG.12A, and FIG. 12B, and the stress-reducing portion 36*bj* has a triangular shape which is convex upward. The electrode-jointing portion 36*bb* is bent from an end of a slowly-inclined portion of the stress-reducing portion 36*bj* and extends outward, and the substrate-jointing portion 36*bc* is bent from an end of a rapidly-inclined portion of the stress-reducing portion 36*bj* and extends outward.

Even when the stress-reducing portion 36*bj* is formed in a triangular shape which is convex upward, it is possible to absorb the difference in linear expansion coefficient between the bare-chip FET 35 and the gate-electrode copper connector 36*b*, the difference in linear expansion coefficient between the substrate 31 and the gate-electrode copper connector 36*b*, and the difference in linear expansion coefficient between the bare-chip FET 35 and the substrate 31.

A third modification example of the stress-reducing portion applied to the gate-electrode copper connector illustrated in FIG. 8A to FIG. 8D, and the first to third modification examples of the gate-electrode copper connector illustrated in FIG. 10A, FIG. 10B, FIG. 11A, FIG. 11B, FIG. 12A, and FIG. 12B will be described below with reference to FIG. 15.

Figure 15:
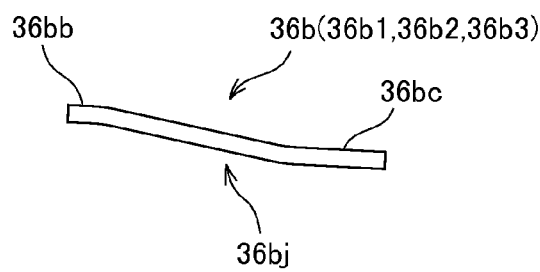
FIG. 15 is a diagram illustrating a third modification example of the stress-reducing portion applied to the gate-electrode copper connector illustrated in FIG. 8A to FIG. 8D, and the first to third modification examples of the gate-electrode copper connector illustrated in FIG. 10A, FIG. 10B, FIG. 11A, FIG. 11B, FIG.12A, and FIG. 12B.

The shape of the stress-reducing portion 36*bj* of the gate-electrode copper connector 36*b* illustrated in FIG. 15 can be applied to any of the gate-electrode copper connector 36*b* illustrated in FIG. 8A to FIG. 8D, and the first to third modification examples 36*b*1, 36*b*2, and 36*b*3 of the gate-electrode copper connector illustrated in FIG. 10A, FIG. 10B, FIG. 11A, FIG. 11B, FIG.12A, and FIG. 12B, and the stress-reducing portion 36*bj* has a straight shape extending obliquely upward. The electrode-jointing portion 36*bb* is bent from an upper end of the stress-reducing portion 36*bj* and extends outward, and the substrate-jointing portion 36bc is bent from the other lower end of the stress-reducing portion 36bj and extends outward.

Even when the stress-reducing portion 36bj is formed in a straight shape which is inclined obliquely upward, it is possible to absorb the difference in linear expansion coefficient between the bare-chip FET 35 and the gate-electrode copper connector 36b, the difference in linear expansion coefficient between the substrate 31 and the gate-electrode copper connector 36b, and the difference in linear expansion coefficient between the bare-chip FET 35 and the substrate 31.

A fourth modification example of the stress-reducing portion applied to the gate-electrode copper connector illustrated in FIG. 8A to FIG. 8D, and the first to third modification examples of the gate-electrode copper connector illustrated in FIG. 10A, FIG. 10B, FIG. 11A, FIG. 11B, FIG.12A, and FIG. 12B will be described below with reference to FIG. 16.

Figure 16:
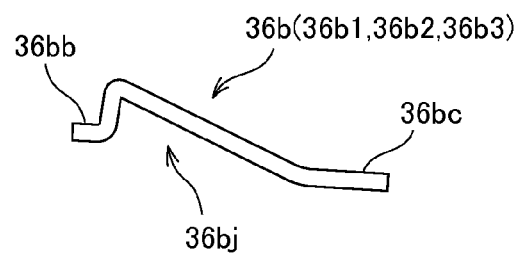
FIG. 16 is a diagram illustrating a fourth modification example of the stress-reducing portion applied to the gate-electrode copper connector illustrated in FIG. 8A to FIG. 8D, and the first to third modification examples of the gate-electrode copper connector illustrated in FIG. 10A, FIG. 10B, FIG. 11A, FIG. 11B, FIG.12A, and FIG. 12B.
Figure 17:
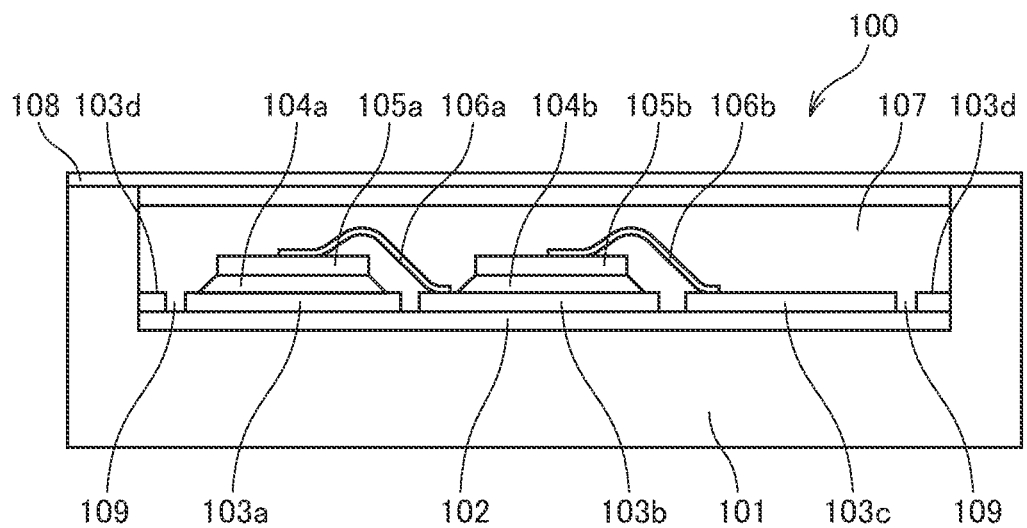
FIG. 17 is a cross-sectional view schematically illustrating an example of a semiconductor module in the related art.
Figure 18:
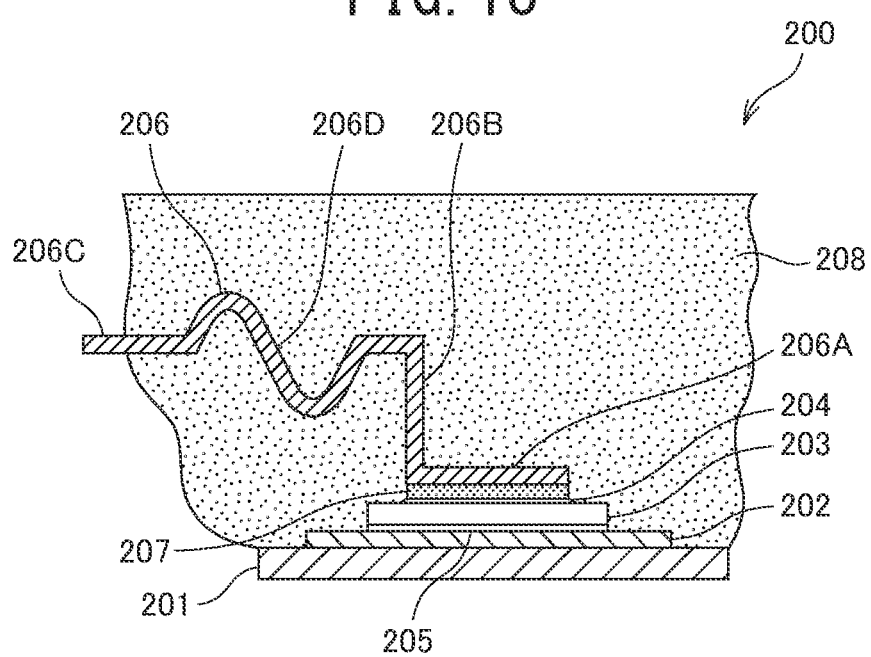
FIG. 18 is a cross-sectional view illustrating another example of the semiconductor module in the related art.
Figure 19:
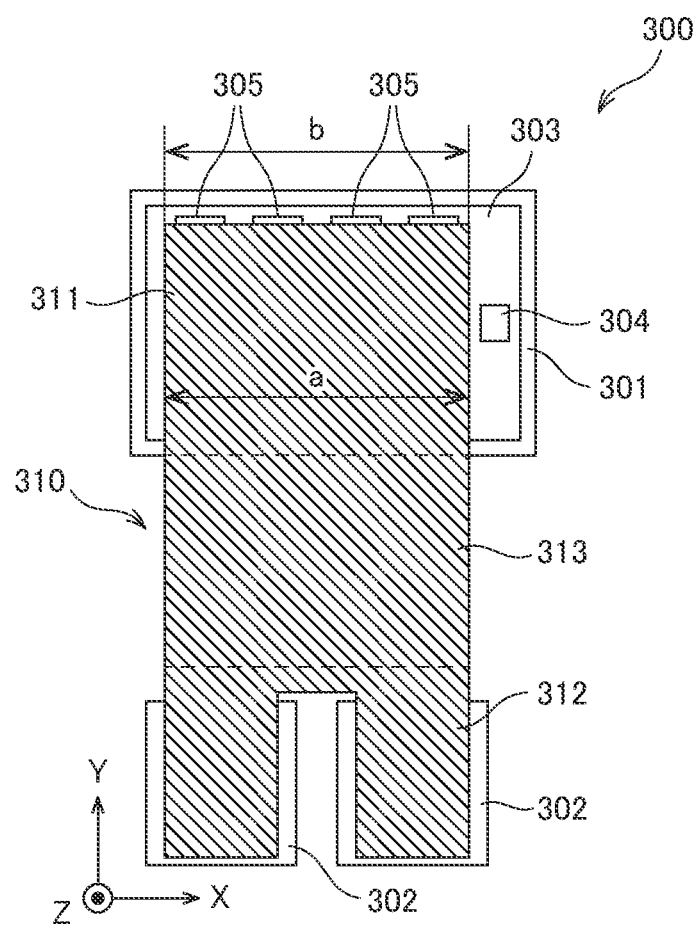
FIG. 19 is a plan view schematically illustrating still another example of the semiconductor module in the related art.

The shape of the stress-reducing portion 36bj of the gate-electrode copper connector 36b illustrated in FIG. 16 can be applied to any of the gate-electrode copper connector 36b illustrated in FIG. 8A to FIG. 8D, and the first to third modification examples 36b1, 36b2, and 36b3 of the gate-electrode copper connector illustrated in FIG. 10A, FIG. 10B, FIG. 11A, FIG. 11B, FIG.12A, and FIG. 12B, and the stress-reducing portion 36bj has a triangular shape which is convex upward. Unlike the stress-reducing portion 36bj illustrated in FIG. 15, the electrode-jointing portion 36bb is bent from an end of a rapidly-inclined portion of the stress-reducing portion 36bj and extends outward, and the substrate-jointing portion 36bc is bent from an end of a slowly-inclined portion of the stress-reducing portion 36bj and extends outward.

Even when the stress-reducing portion 36bj is formed in a triangular shape which is convex upward, it is possible to absorb the difference in linear expansion coefficient between the bare-chip FET 35 and the gate-electrode copper connector 36b, the difference in linear expansion coefficient between the substrate 31 and the gate-electrode copper connector 36b, and the difference in linear expansion coefficient between the bare-chip FET 35 and the substrate 31.

While the embodiment of the present invention is described above, the present invention is not limited to the embodiment and can be modified and improved in various forms.

For example, the semiconductor module 30 employs the bare-chip FET 35, but is not limited to the bare-chip FET 35 and may employ other bare-chip transistors such as a bare-chip IGBT. When another bare-chip transistor is employed, the top of an electrode formed on the top surface of the bare-chip transistor and the top of the wiring pattern other than the wiring pattern connected to the bare-chip transistor out of plural wiring patterns can be jointed by use of a copper connector via solders. Accordingly, the jointing between the electrode of the bare-chip transistor and the wiring pattern on the substrate can be performed simultaneously in the same process as the solder mounting operation for mounting the bare-chip transistor or other substrate-mounted components on the wiring patterns on the substrate.

When a bare-chip IGBT is used as the bare-chip transistor, it is preferable that the emitter electrode and the gate electrode formed on the bare-chip IGBT be connected to the wiring pattern on the substrate by use of the copper connector via solders.

In this way, when the bare-chip IGBT is used and the emitter electrode and the gate electrode formed on the bare-chip IGBT are connected to the wiring pattern on the substrate by use of the copper connector via solders, the jointing between the emitter electrode of the bare-chip IGBT and the wiring pattern on the substrate and the jointing between the gate electrode of the bare-chip IGBT and the wiring pattern on the substrate can be performed simultaneously in the same process as the solder mounting operation for mounting the bare-chip IGBT or other substrate-mounted components on the wiring patterns on the substrate.

The examples where the copper connector according to the present invention is applied to the gate-electrode copper connector 36b are described above, the copper connector according to the present invention may be applied to the source-electrode copper connector 36a.

Furthermore, the gate-electrode copper connector 36b to which the present invention is applied is not limited to the examples illustrated in FIG. 8A to FIG. 8D, FIG. 10A, FIG. 10B, FIG. 11A, FIG. 11B, FIG.12A, FIG. 12B, and FIG. 13 to FIG. 16 as long as the width W1 of the electrode jointing portion 36bb in the direction perpendicular to the one direction is smaller than the width W2 of the substrate-jointing portion 36bc in the direction perpendicular to the one direction.

Furthermore, in the semiconductor module 30, there is one type of gate-electrode copper connector and there are two types of source-electrode copper connectors including a first source-electrode copper connector (see Tr2 and Tr4 in FIG. 4) arranged 180 degrees straightly with respect to the gate-electrode copper connector and a second source-electrode copper connector (see Tr1, Tr3, and Tr5 in FIG. 4) arranged 90 degrees perpendicularly with respect to the gate-electrode copper connector. The one type of gate-electrode copper connector and any source-electrode copper connector selected from two types of the first source-electrode copper connector and the second source-electrode copper connector can be used in combination for one bare-chip FET.

The arrangement (the angle formed by the gate-electrode copper connector and the first source-electrode copper connector) of the first source-electrode copper connector with respect to the gate-electrode copper connector preferably ranges from 95 degrees to 265 degrees, more preferably ranges from 160 degrees to 200 degrees, still more preferably ranges from 175 degrees to 185 degrees, and is most preferably set to 180 degrees.

The arrangement (the angle formed by the gate-electrode copper connector and the second source-electrode copper connector) of the second source-electrode copper connector with respect to the gate-electrode copper connector preferably ranges from 5 degrees to 175 degrees, more preferably ranges from 70 degrees to 120 degrees, still more preferably ranges from 85 degrees to 95 degrees, and is most preferably set to 90 degrees.

Similarly to the above-mentioned semiconductor module 30, according to this semiconductor module, a degree of freedom in arranging the bare-chip transistor mounted on the substrate increases, a degree of freedom in design of wirings on the substrate increases, and thus the layout of the semiconductor module on the substrate can be made to be compact. It is possible to easily make the path lengths for phases of a three-phase motor on the substrate identical. Accordingly, it is possible to make characteristics of the phases of the three-phase motor, particularly, the impedance characteristics of the phases, easily match each other, thereby improving ripple accuracy of torque, velocity, and so on.

REFERENCE SIGNS LIST

1: steering wheel
2: column shaft
3: reduction gear 4A, 4B: universal joint
5: rack and pinion mechanism
6: tie rod
7: torque sensor
8: electric motor
9: vehicle velocity sensor
10: controller
11: control calculating device
12: gate drive circuit
13: motor drive unit
14: breaker device for emergency stop
15: current detecting circuit
16: rotation sensor
17: rotor position detecting circuit
18: IGN voltage monitoring unit
19: power supply circuit unit
20: case
21: semiconductor module placement section
21a: screw hole
22: power/signal connector mounting section
23: three-phase output connector mounting section
23a: screw hole
24: attachment post
24a: screw hole
30: semiconductor module
31: substrate
31a: through-hole
32: insulating layer
33a to 33d: wiring pattern
34a to 34d: solder
35: bare-chip FET (bare-chip transistor)
36a: source-electrode copper connector
36aa: flat plate portion
36ab: electrode-jointing portion
36ac: substrate-jointing portion
36b: gate-electrode copper connector
36ba: flat plate portion
36bb: electrode-jointing portion
36bc: substrate-jointing portion
36bd: first coupling portion
36be: second coupling portion
36bf: first bent portion
36bg: second bent portion
36bh: third bent portion
36bf: fourth bent portion
36bf: stress-reducing portion
36bk: balancing rib portion
36b1: gate-electrode copper connector (first modification example)
36b2: gate-electrode copper connector (second modification example)
36b3: gate-electrode copper connector (third modification example)
37: substrate-mounted components
38: attachment screw
39: heat-dissipating sheet
40: control circuit substrate
40a: through-hole
41: attachment screw
50: power/signal connector
51: attachment screw
60: three-phase output connector
60a: through-hole
61: attachment screw
70: cover
81: power supply line
81a: positive electrode terminal
82: ground line
82a: negative electrode terminal
90: three-phase output portion
91a: a-phase output line
91b: b-phase output line
91c: c-phase output line
G: gate electrode (electrode)
S: source electrode (electrode)

The invention claimed is:

1. A semiconductor module comprising:
a substrate made of a metal;
an insulating layer formed on the substrate;
a plurality of wiring patterns formed on the insulating layer;
a bare-chip transistor mounted on one wiring pattern out of the plurality of wiring patterns via a solder; and
a copper connector formed of a copper plate, the copper connector jointing an electrode formed on a top surface of the bear-chip transistor and another wiring pattern out of the plurality of wiring patterns via a solder,
wherein the copper connector includes an electrode-jointing portion jointed to the electrode of the bare-chip transistor and a substrate-jointing portion arranged to face the electrode jointing portion in one direction and jointed to the another wiring pattern out of the plurality of wiring patterns,
a width of the electrode-jointing portion in a direction perpendicular to the one direction is smaller than a width of the substrate-jointing portion in the direction perpendicular to the one direction,
a stress-reducing portion is arranged between the electrode-jointing portion and the substrate jointing portion,
the stress-reducing portion includes a flat plate portion, a first coupling portion bent down from one end of the flat plate portion, and a second coupling portion bent down from another end of the flat plate portion so as to form a bridge shape, the electrode-jointing portion is formed to be bent from the first coupling portion and to extend outward, and the substrate jointing portion is formed to be bent from the second coupling portion and to extend outward, and
balancing rib portions is formed at both ends of the flat plate portion in the direction perpendicular to the one direction, respectively, the balancing rib portions being bent down from the both ends, respectively.

2. The semiconductor module according to claim 1, wherein thicknesses of the electrode-jointing portion and the substrate jointing portion of the copper connector are larger than a thickness of portion of the copper connector other than the electrode-jointing portion and the substrate jointing portion.

3. The semiconductor module according to claim 1, wherein the electrode-jointing portion is located substantially at the center of the substrate-jointing portion in a width direction perpendicular to the one direction.

4. The semiconductor module according to claim 1, wherein the first coupling portion is formed in a tapered shape of which a width gradually decreases from the flat plate portion to the electrode-jointing portion, and a narrowest portion of the first coupling portion is a bending baseline of the electrode-jointing portion.

5. The semiconductor module according to claim 1, wherein the bare-chip transistor is a bare-chip FET having a top surface on which a source electrode and a gate electrode having a joint area smaller than a joint area of the source electrode are formed, and the copper connector is a gate-electrode copper connector of which the electrode jointing portion is jointed to the gate electrode.

6. The semiconductor module according to claim 1, wherein the bare-chip transistor is a bare-chip FET having a source electrode and a gate electrode formed on a top surface thereof, the copper connector includes a source electrode copper connector and a gate electrode copper connector, the source electrode of the bare-chip FET and the another wiring pattern out of the plurality of wiring patterns are jointed by the source electrode copper connector via a solder, the gate electrode of the bare-chip FET and a further another wiring pattern out of the plurality of wiring patterns is jointed by the gate electrode copper connector via a solder, the gate electrode copper connector falls into one type, and the source electrode copper connector falls into two types including a first source electrode copper connector arranged 180 degrees straightly with respect to the gate electrode copper connector, and a second source electrode copper connector arranged 90 degrees perpendicularly with respect to the gate electrode copper connector, and the one type of the gate electrode copper connector and the source electrode copper connector selected from either of the two types including the first source electrode copper connector or the second source electrode copper connector are used in combination with each other on one bare-chip FET.

* * * * *